United States Patent
Cho et al.

(10) Patent No.: US 12,414,394 B2
(45) Date of Patent: Sep. 9, 2025

(54) COMBINATION STRUCTURES AND OPTICAL FILTERS AND IMAGE SENSORS AND CAMERA MODULES AND ELECTRONIC DEVICES

(71) Applicant: Samsung Electronics Co., Ltd., Suwon-si (KR)

(72) Inventors: Chung Kun Cho, Suwon-si (KR); Mi Jeong Kim, Hwaseong-si (KR); Hyung Jun Kim, Suwon-si (KR); Hye Ran Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 353 days.

(21) Appl. No.: 18/160,935

(22) Filed: Jan. 27, 2023

(65) Prior Publication Data

US 2023/0170364 A1 Jun. 1, 2023

Related U.S. Application Data

(62) Division of application No. 16/918,505, filed on Jul. 1, 2020, now Pat. No. 11,569,284.

(30) Foreign Application Priority Data

Sep. 3, 2019 (KR) .......................... 10-2019-0109005

(51) Int. Cl.
*H10F 39/00* (2025.01)
*G02B 5/22* (2006.01)
(Continued)

(52) U.S. Cl.
CPC ........... *H10F 39/8053* (2025.01); *G02B 5/22* (2013.01); *G02B 5/282* (2013.01); *H10F 39/184* (2025.01);
(Continued)

(58) Field of Classification Search
CPC .. H10F 39/8053; H10F 39/184; H10F 39/806; G02B 5/22
(Continued)

(56) References Cited

U.S. PATENT DOCUMENTS 9,335,217 B2 5/2016 Pisano et al.
9,479,645 B2 10/2016 Moore et al.
(Continued)

FOREIGN PATENT DOCUMENTS

CN 102856663 B 7/2014
CN 107329285 A 11/2017
(Continued)

OTHER PUBLICATIONS

Spinelli, Pierpaolo et al., "Light Trapping in Thin Crystalline Si Solar Cells Using Surface Mie Scatterers", IEEE Journal of Photovoltaics, Vo. 4, No. 2, pp. 554-559, Mar. 2014.
(Continued)

*Primary Examiner* — Michael G Lee
(74) *Attorney, Agent, or Firm* — Harness, Dickey & Pierce, P.L.C.

(57) ABSTRACT

A combination structure includes an in-plane pattern of unit cells, wherein the each unit cell includes nanostructures each having a dimension that is smaller than a near-infrared wavelength and a light-absorbing layer adjacent to the nanostructures and including a near-infrared absorbing material configured to absorb light in at least a portion of a near-infrared wavelength spectrum. The nanostructures are define a nanostructure array in the unit cells, and a wavelength width at 50% transmittance of a transmission spectrum in the near-infrared wavelength spectrum of the combination structure is wider than a wavelength width at 50% transmittance of a transmission spectrum in the near-infrared wavelength spectrum of the nanostructure array.

20 Claims, 20 Drawing Sheets

(51) Int. Cl.
*G02B 5/28* (2006.01)
*H10F 39/18* (2025.01)

(52) U.S. Cl.
CPC ......... *H10F 39/806* (2025.01); *H10F 39/809* (2025.01)

(58) Field of Classification Search
USPC .......................................... 359/885
See application file for complete search history.

(56) References Cited

U.S. PATENT DOCUMENTS

| | | |
|---|---|---|
| 9,848,087 B2 | 12/2017 | Moore et al. |
| 10,408,979 B2 | 9/2019 | Yoshioka et al. |
| 2006/0144713 A1 | 7/2006 | Song et al. |
| 2012/0161090 A1 | 6/2012 | Zhu et al. |
| 2017/0287981 A1 | 10/2017 | Han et al. |
| 2017/0363959 A1 | 12/2017 | Takahashi et al. |
| 2018/0149783 A1 | 5/2018 | Won et al. |
| 2018/0166592 A1 | 6/2018 | Tseng et al. |
| 2020/0264101 A1* | 8/2020 | Zheng .................... G01N 21/19 |
| 2021/0066370 A1* | 3/2021 | Cho ........................ G02B 5/208 |
| 2021/0375960 A1* | 12/2021 | Wu ....................... H10F 77/337 |

FOREIGN PATENT DOCUMENTS

| | | |
|---|---|---|
| EP | 2698654 A1 | 2/2014 |
| JP | 3102496 B2 | 10/2000 |
| JP | 2008-181097 A | 8/2008 |
| JP | 2009-227860 A | 10/2009 |
| JP | 2016-146619 A | 8/2016 |
| JP | 2016-528498 A | 9/2016 |
| JP | 2016-204536 A | 12/2016 |
| JP | 2017-182043 A | 10/2017 |
| KR | 10-2006-0058560 A | 5/2006 |
| KR | 10-2012-0022815 A | 3/2012 |
| KR | 10-2012-0078435 A | 7/2012 |
| KR | 10-2016-0032038 A | 3/2016 |
| KR | 10-2017-0023160 A | 3/2017 |
| KR | 10-2017-0120654 A | 10/2017 |
| KR | 101809073 B1 | 12/2017 |
| KR | 10-2019-0029221 A | 3/2019 |

OTHER PUBLICATIONS

Chinese Office Action dated Jul. 10, 2025 for corresponding Chinese Application No. 202010903530.2, and English-language translation thereof.

* cited by examiner

COMBINATION STRUCTURES AND OPTICAL FILTERS AND IMAGE SENSORS AND CAMERA MODULES AND ELECTRONIC DEVICES

CROSS-REFERENCE TO RELATED APPLICATIONS

This application is a divisional of U.S. application Ser. No. 16/918,505, filed Jul. 1, 2020, which claims priority to and the benefit of, under 35 U.S.C. § 119, Korean Patent Application No. 10-2019-0109005 filed in the Korean Intellectual Property Office on Sep. 3, 2019, the entire contents of each of which are incorporated herein by reference.

BACKGROUND

1. Field

Combination structures, optical filters, image sensors, camera modules, and electronic devices are disclosed.

2. Description of the Related Art

Electronic devices including image sensors that store an image as an electrical signal, such as a cell phone, a digital camera, a camcorder, or a camera, have been used.

These electronic devices may include an optical filter in order to reduce or prevent an optical distortion by light in the other regions (e.g., other wavelength spectra) than a visible wavelength spectrum or improve visibility by light in the other wavelength spectra than a visible wavelength spectrum.

SUMMARY

Some example embodiments provide a combination structure capable of achieving desired optical properties for light except for visible wavelength regions ("wavelength regions" or "regions" being referred to interchangeably herein as "wavelength spectra") with a thin thickness.

Some example embodiments provide an optical filter including the combination structure.

Some example embodiments provide an image sensor including the combination structure or the optical filter.

Some example embodiments provide a camera module including the combination structure, the optical filter or the image sensor.

Some example embodiments provide an electronic device including the combination structure, the optical filter, the image sensor, or the camera module.

According to some example embodiments, a combination structure may include an in-plane pattern of unit cells, wherein each unit cell of the unit cells includes nanostructures each having a dimension that is smaller than a near-infrared wavelength, and a light-absorbing layer adjacent to the nanostructures, the light-absorbing layer including a near-infrared absorbing material configured to absorb light in at least a portion of a near-infrared wavelength spectrum. The nanostructures may define a nanostructure array in the unit cells. A wavelength width at 50% transmittance of a transmission spectrum in the near-infrared wavelength spectrum of the combination structure may be wider than a wavelength width at 50% transmittance of a transmission spectrum in the near-infrared wavelength spectrum of the nanostructure array.

The transmission spectrum in the near-infrared wavelength spectrum of the nanostructure array may have a first local minimum point and a second local minimum point separated from each other and a first local maximum point between the first local minimum point and the second local minimum point, and a difference between a transmittance at either the first local minimum point or the second local minimum point and a transmittance at the first local maximum point may be greater than about 30%.

The transmission spectrum in the near-infrared wavelength spectrum of the combination structure may have a third local minimum point and a fourth local minimum point separated from each other and a second local maximum point between the third local minimum point and the fourth local minimum point, and a difference between a transmittance at either the third local minimum point and the fourth local minimum point and a transmittance at the second local maximum point may be smaller than the difference between the transmittance at either the first local minimum point or the second local minimum point and the transmittance at the first local maximum point.

The difference between the transmittance at either the third local minimum point and the fourth local minimum point and the transmittance at the second local maximum point may be less than about 30%.

The nanostructure array may include a parallel pattern of a first nanostructure, a second nanostructure, and a third nanostructure, and a magnitude of a gap between the first nanostructure and the second nanostructure may differ from a magnitude of a gap between the second nanostructure and the third nanostructure.

The gap between the first nanostructure and the second nanostructure may be about 1.05 times to about 5 times as large as the gap between the second nanostructure and the third nanostructure.

The nanostructure array may include a first nanostructure and a second nanostructure which are adjacent to each other and a dimension of the first nanostructure may be different from a dimension of the second nanostructure.

A width of the first nanostructure may be about 1.05 times to 5 times as large as a width of the second nanostructure.

A thickness of the first nanostructure may be about 1.05 times to 5 times as large as a thickness of the second nanostructure.

The unit cells may include a first unit cell and a second unit cell which are adjacent to each other, the first unit cell may include a first nanostructure and a second nanostructure, the second unit cell may include a third nanostructure and a fourth nanostructure, the first nanostructure, the second nanostructure, the third nanostructure, and the fourth nanostructure may define a linear sequence of nanostructures extending in one direction, and a magnitude of a gap between the first nanostructure and the second nanostructure may differ from a magnitude of a gap between the second nanostructure and the third nanostructure.

The gap between the first nanostructure and the second nanostructure may be about 0.2 times to about 0.9 times or about 1.05 times to about 5 times as large as a gap between the second nanostructure and the third nanostructure.

A wavelength width at the 50% transmittance of the transmission spectrum in the near-infrared wavelength spectrum of the combination structure may be about 1.2 times to 5 times as large as a wavelength width at the 50% transmittance of the transmission spectrum in the near-infrared wavelength spectrum of the nanostructure array.

A wavelength width at the 50% transmittance of the transmission spectrum in the near-infrared wavelength spectrum of the combination structure may be about 40 nm to about 200 nm.

The light-absorbing layer may be at at least one of a lower surface, an upper surface, and/or one or more side surfaces of one or more nanostructures of the nanostructures.

The nanostructure and the light-absorbing layer may be in contact with each other.

The near-infrared wavelength may be in a range of greater than about 700 nm and less than or equal to about 1200 nm.

The near-infrared wavelength may be in a range of about 890 nm to about 990 nm.

The nanostructures may each include a high refractive material having a refractive index of greater than or equal to about 2.0 at a wavelength of 940 nm.

The nanostructure may each include titanium oxide, silicon, aluminum, a Group III-V semiconductor compound, or a combination thereof.

A maximum absorption wavelength of the near-infrared absorbing material may be in a range of about 890 nm to about 990 nm.

A thickness of the combination structure may be less than or equal to about 1 μm.

According to some example embodiments, a combination structure may include an in-plane pattern of unit cells. Each unit cell of the unit cells may include two or more nanostructures each having a smaller dimension than a near-infrared wavelength, and a light-absorbing layer adjacent to at least one of a lower surface, an upper surface, and/or one or more side surfaces of one or more nanostructures of the two or more nanostructures, the light-absorbing layer including a near-infrared absorbing material configured to absorb light of at least a portion of a near-infrared wavelength spectrum. The unit cells may include a first unit cell and a second unit cell adjacent to each other. The first unit cell may include a first nanostructure and a second nanostructure. The second unit cell may include a third nanostructure and a fourth nanostructure. The first nanostructure, second nanostructure, third nanostructure, and fourth nanostructure may define a linear sequence of nanostructures extending in one direction. A dimension of the first nanostructure may be different from a dimension of the second nanostructure, or a magnitude of a gap between the first nanostructure and the second nanostructure may be different from a magnitude of a gap between the second nanostructure and the third nanostructure.

The dimension of the first nanostructure may be different from the dimension of the second nanostructure, and the width of the first nanostructure may be about 1.05 times to about 5 times as large as the width of the second nanostructure.

The gap between the first nanostructure and the second nanostructure may differ from the gap between the second nanostructure and the third nanostructure, and the gap between the first nanostructure and the second nanostructure may be about 0.2 times to about 0.9 times or about 1.05 times to about 5 times as large as the gap between the second nanostructure and the third nanostructure.

According to some example embodiments, an optical filter including the combination structure is provided.

According to some example embodiments, a camera including the optical filter is provided.

According to some example embodiments, an image sensor may include a semiconductor substrate including a plurality of photodiodes and an optical filter on the semiconductor substrate and configured to block light in at least a portion of near-infrared wavelength spectra, wherein the optical filter includes the combination structure.

The image sensor may further include a color filter on the optical filter.

According to some example embodiments, a camera includes the image sensor.

According to some example embodiments, an electronic device includes the optical filter, the image sensor or the camera.

Desired optical properties for light in near-infrared wavelength spectra with a thin thickness may be effectively implemented.

DETAILED DESCRIPTION

Figure 1:
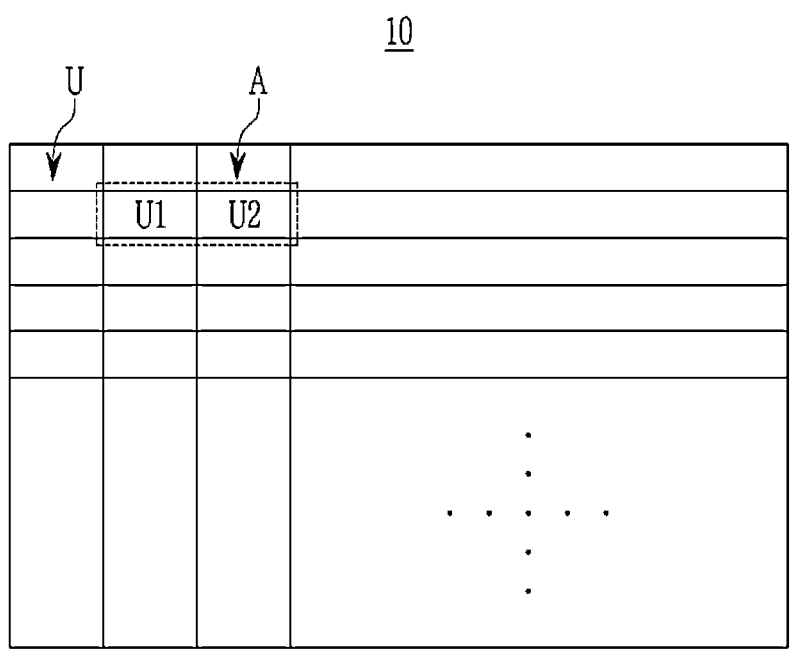
FIG. 1 is a top plan view showing an arrangement of a plurality of unit cells in a combination structure according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a combination structure according to some example embodiments is described with reference to drawings.

Figure 2:
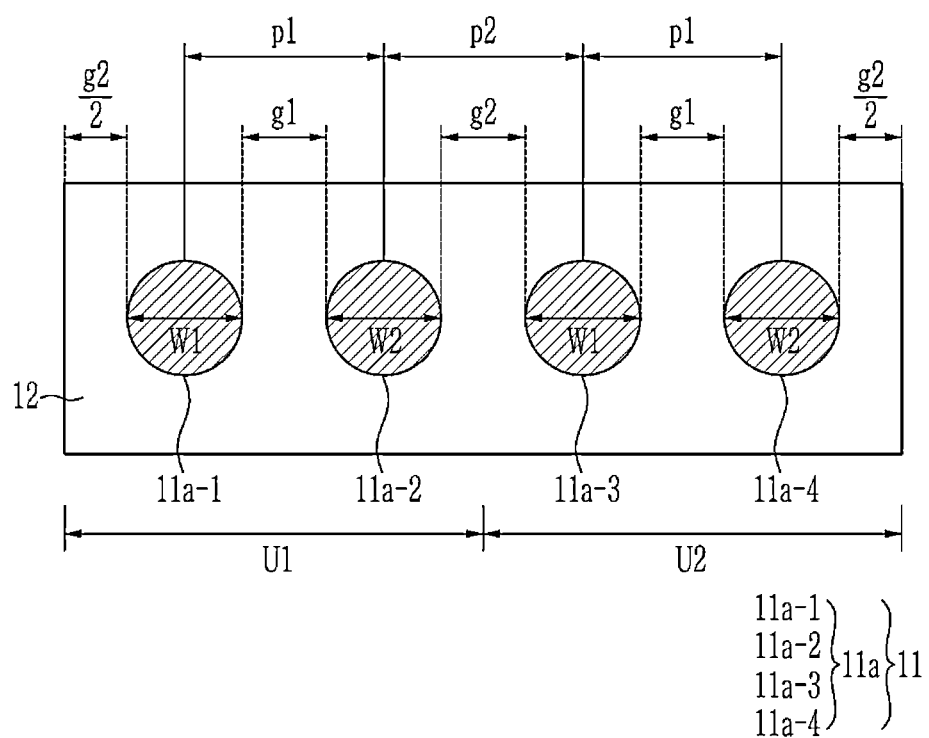
FIG. 2 is a schematic top plan view showing an enlarged example of the region A of the combination structure 1 of FIG. 1.
Figure 3:
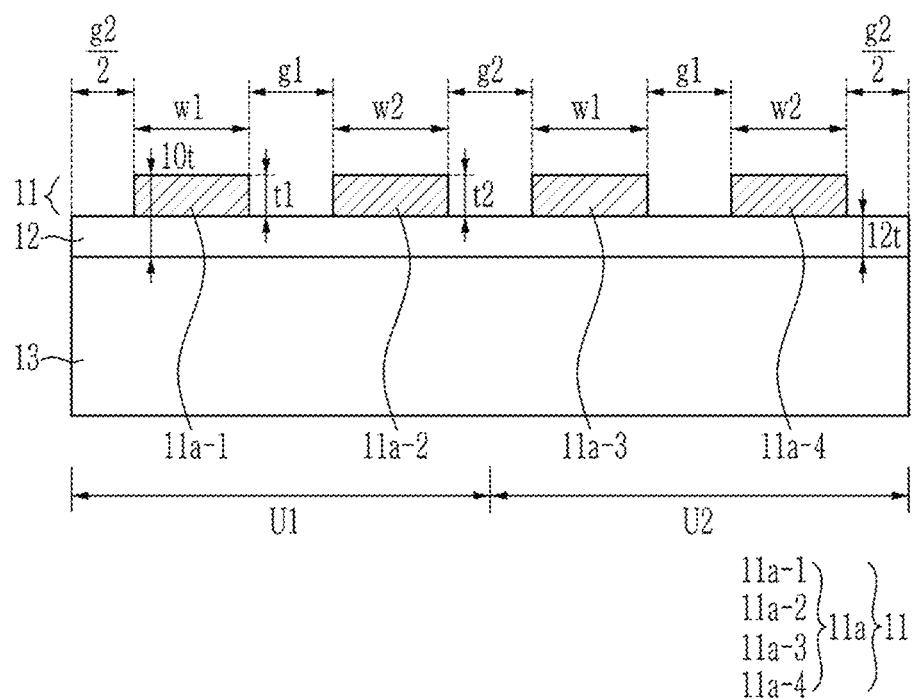
FIG. 3 is a schematic cross-sectional view showing an enlarged example of the region A of the combination structure 1 of FIG. 1.

FIG. 1 is a top plan view showing an arrangement of a plurality of unit cells in a combination structure according to some example embodiments, FIG. 2 is a schematic top plan view showing an enlarged example of the region A of the combination structure 1 of FIG. 1, and FIG. 3 is a schematic cross-sectional view showing an enlarged example of the region A of the combination structure 1 of FIG. 1.

A combination structure 10 according to some example embodiments includes a plurality of unit cells (U) arranged repeatedly along an in-plane direction, for example a plurality of unit cells (U) are regularly or periodically along rows and/or columns. For example, the combination structure 10 may include a plurality of unit cells arranged repeatedly or periodically (e.g., in a pattern) in a plane to establish an in-plane (e.g., two-dimensional) pattern (e.g., "array") of unit cells (U). A plurality of unit cells (U) arranged repeatedly in one or more in-plane directions may be referred to herein interchangeably as an in-plane pattern of unit cells (U), where said in-plane pattern may include at least one row pattern and/or column pattern of unit cells (U) and/or an array of unit cells (U) arranged in at least one row and/or at least one column (e.g., a plurality of rows and a plurality of columns).

Each unit cell (U) includes one or more three-dimensional nanostructures 11a and a light-absorbing layer 12. In some example embodiments, a given unit cell (U) may include a single nanostructure 11a and the light-absorbing layer 12, and it will be understood that descriptions presented herein with regard to "the nanostructures 11a" and/or a plurality of nanostructure 11a may apply to nanostructures 11a in a plurality of unit cells (U) where each unit cell (U) includes a single, individual nanostructure 11a instead of a plurality of nanostructures 11a.

In some example embodiments, each unit cell (U) may include two or more nanostructures 11a. In the drawing, in some example embodiments, the structure in which two nanostructures 11a are included in each unit cell (U) is illustrated but some example embodiments are not limited thereto. Each unit cell (U) may include two or more nanostructures 11a, for example 2 to 10, 2 to 8, 2 to 7, 2 to 6, or 2 to 5 nanostructures 11a.

In some example embodiments, a unit cell (U) includes a plurality of nanostructures 11a that may be arranged repeatedly or periodically along a row and/or column in a plurality of unit cells (U) to form a nanostructure array 11. Restated, the plurality of nanostructures 11a may define a nanostructure array 11 in the plurality of unit cells (U). The nanostructure array 11 may be a structure having optical properties called metamaterials or metastructures, and may exhibit unique optical properties that do not appear in two-dimensional planar structures, according to a repetitive or periodic arrangement of a plurality of three-dimensional nanostructures 11a.

The nanostructures 11a may include a high refractive index material having a high refractive index. The refractive index may have a wavelength distribution and the nanostructures 11a may each include a high refractive index material having a refractive index at about 900 nm to about 1000 nm (e.g., about 940 nm) of for example greater than or equal to about 2.0, greater than or equal to about 2.3, greater than or equal to about 2.5, greater than or equal to about 3.0, greater than or equal to about 3.5, or greater than or equal to about 4.0. In some example embodiments, a refractive index of the nanostructures 11a may be about 2.0 to about 5.0, about 2.3 to about 5.0, about 2.5 to about 5.0, about 2.0 to about 4.0, about 2.3 to about 4.0, about 2.5 to about 4.0, or about 2.5 to about 3.5. In some example embodiments, the nanostructures 11a may each include an insulator, a conductor, a semiconductor, or a combination thereof having the refractive index, for example an oxide, a nitride, a sulfide, a metal, a semiconductor, a semiconductor compound, or a combination thereof, for example a titanium oxide, a zinc oxide, an indium oxide, a zirconium oxide, silicon, aluminum, a Group III-V semiconductor compound, or a combination thereof, but are not limited thereto.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The one or more nanostructures 11a may each be a three dimensional structure having a particular (or, alternatively, predetermined) width (W) and thickness (t), in some example embodiments, a rectangular parallelepiped shape, a right hexahedral shape, a cylindrical shape, or a disk shape, but are not limited thereto. A cross-sectional shape of the nanostructures 11a may be for example a rectangle or a square.

The plurality of nanostructures 11a may be arranged with a particular (or, alternatively, predetermined) period (p) and/or gap (g), wherein the period (p) may be a length between centers of the adjacent nanostructures 11a, and the gap (g) may be a length between facing surfaces of the adjacent nanostructures 11a.

The nanostructure array 11 and/or the nanostructures 11a may be configured to reflect or absorb light of a particular (or, alternatively, predetermined) wavelength and thus exhibit optical properties, in some example embodiments, reflect or absorb light of a desired wavelength by controlling a shape, geometry, dimension, and/or orientation of the nanostructures 11a and/or an arrangement of the nanostructure array 11. In some example embodiments, one or more dimensions of the nanostructures 11a may be a subwavelength which is smaller than a wavelength of light for reflection or absorption (e.g., smaller than the particular wavelength). Herein, the one or more dimensions of the nanostructures 11a may include a width and/or a thickness, when the nanostructures 11a has the cylindrical or disk shape, the width of the nanostructures 11a may be a diameter.

The nanostructure array 11 may be configured to reflect or absorb light of a particular (or, alternatively, predetermined) wavelength belonging to a near-infrared wavelength spectrum (e.g., a particular near-infrared wavelength spectrum), wherein one or more dimensions of the nanostructures 11a (e.g., one or more of width (W), diameter, thickness (t), period (p), gap (g), any combination thereof, or the like) may be less than the particular (or, alternatively, predetermined) near-infrared wavelength belonging to the near-infrared wavelength spectrum. It will be understood that the "near-infrared wavelength spectrum" as described herein with regard to the nanostructures 11a and/or the light-absorbing layer 12 may refer to the same near-infrared wavelength spectrum. Herein, the near-infrared wavelength spectrum may be greater than about 700 nm and less than or equal to about 1200 nm, within the range, for example greater than about 700 nm and less than or equal to about 1100 nm, about greater than about 700 nm and less than or equal to about 1000 nm, about 750 nm to about 1100 nm, about 750 nm to about 1000 nm, about 800 nm to about 1000 nm, about 850 nm to about 990 nm, about 870 nm to about 990 nm, or about 890 nm to about 990 nm. For example, the one or more dimensions of the nanostructures 11a (e.g., one or more of width (W), diameter, thickness (t), period (p), gap (g), any combination thereof, or the like) may be less than the particular (or, alternatively, predetermined) near-infrared wavelength, where the particular near-infrared wavelength is in a range of, for example, greater than about 700 nm and less than or equal to about 1200 nm, within the range, for example greater than about 700 nm and less than or equal to about 1100 nm, about greater than about 700 nm and less than or equal to about 1000 nm, about 750 nm to about 1100 nm, about 750 nm to about 1000 nm, about 800 nm to about 1000 nm, about 850 nm to about 990 nm, about 870 nm to about 990 nm, or about 890 nm to about 990 nm.

The width (W) of the nanostructures 11a may be for example less than or equal to about 1100 nm, within the range for example about 100 nm to about 1000 nm, about 100 nm to about 800 nm, about 100 nm to about 500 nm, about 200 nm to about 500 nm, or about 300 nm to about 500 nm.

The thickness (t) of the nanostructures 11a may be for example less than or equal to about 1100 nm, within the range for example about 50 nm to about 1000 nm, about 50 nm to about 800 nm, about 50 nm to about 700 nm, about 50 nm to about 600 nm, about 50 nm to about 500 nm, about 100 nm to about 500 nm, about 150 nm to about 500 nm, or about 200 nm to about 400 nm.

The gap (g) of the nanostructures 11a may be for example less than or equal to about 1100 nm, within the range for example about 50 nm to about 1000 nm, about 50 nm to about 500 nm, about 50 nm to about 400 nm, about 70 nm to about 400 nm, about 70 nm to about 300 nm, or about 80 nm to about 300 nm.

The period (p) of the nanostructures 11a may be for example less than or equal to about 1100 nm, within the range for example about 200 nm to about 1000 nm, about 200 nm to about 800 nm, about 200 nm to about 700 nm, about 300 nm to about 700 nm, or about 400 nm to about 700 nm.

The nanostructure array 11 includes a plurality of nanostructures 11a which are arranged repeatedly or periodically along a row and/or column in a plurality of unit cells (U) as described above, and a portion of the plurality of nanostructures 11a may differ at least one of a dimension such as a width (w), a thickness (t), a gap (g), and/or a period (p), compared with the rest of the nanostructures 11a.

In some example embodiments, at least one nanostructure 11a out of the plurality of nanostructures 11a in each unit cell (U) may have a different dimension from those of the rest (e.g., a remainder portion) of the nanostructures 11a. In some example embodiments, when each unit cell (U) includes a first nanostructure 11a-1 and a second nanostructure 11a-2, a dimension of the first nanostructure 11a-1 may differ from the corresponding dimension of the second nanostructure 11a-2.

In some example embodiments, a width (W1) of the first nanostructure 11a-1 may be different from a width (W2) of the second nanostructure 11a-2. In some example embodiments, the width (W1) of the first nanostructure 11a-1 may be larger than the width (W2) of the second nanostructure 11a-2, in some example embodiments, about 1.05 times to about 10 times as large as the width (W2) of the second nanostructure 11a-2, and within the range, about 1.05 times to about 5 times, about 1.1 times to about 5 times, about 1.2 times to about 5 times, about 1.5 times to about 5 times or about twice to about 5 times as large as the width (W2) of the second nanostructure 11a-2.

In some example embodiments, a thickness (t1) of the first nanostructure 11a-1 may differ from a thickness (t2) of the second nanostructure 11a-2. In some example embodiments, the thickness (t1) of the first nanostructure 11a-1 may be thicker than the thickness (t2) of the second nanostructure 11a-2, in some example embodiments, about 1.05 times to about 10 times as large as the thickness (t2) of the second nanostructure 11a-2 and within the range, about 1.05 times to about 5 times, about 1.1 times to about 5 times, about 1.2 times to about 5 times, about 1.5 times to about 5 times, or about twice to about 5 times the thickness (t2) of the second nanostructure 11a-2.

In some example embodiments, a gap (g) between two nanostructures 11a in each unit cell (U) or its adjacent unit cell (U) may be different from a gap (g) between the rest of the nanostructures 11a. In some example embodiments, for example, as shown in at least FIG. 3, where the nanostructure array 11 includes nanostructures 11a-1 to 11a-4 arranged in parallel (e.g., a parallel pattern of the nanostructures 11a-1 to 11a-4) when the first nanostructure 11a-1 and the second nanostructure 11a-2 are included in a first unit cell (U1), a third nanostructure 11a-3 and a fourth nanostructure 11a-4 are included in a second unit cell (U2), the gap (g1) between the first nanostructure 11a-1 and the second nanostructure 11a-2 may be different from a gap (g2) between the second nanostructure 11a-2 and the third nanostructure 11a-3.

As described herein, where any dimension is described to be different from any other dimension (e.g., gap (g1) being different from gap (g2) as described above), it will be understood that the magnitude of the dimension may be different from the magnitude of the other dimension (e.g., the magnitude of gap (g1) may be different from the magnitude of gap (g2)).

As shown in FIG. 3, the first unit cell U1 may include first and second nanostructures 11a-1 and 11a-2, a second unit cell U2 that is adjacent to unit cell U1 may include third and fourth nanostructures 11a-3 and 11a-4, the first through fourth nanostructures 11a-1 to 11a-4 may define a linear sequence of nanostructures 11a extending in one direction, and a magnitude of a gap (g1) between the first and second nanostructures 11a-1 and 11a-2 may be different from a magnitude of a gap (g2) between the second and third nanostructures 11a-2 and 11a-3.

In some example embodiments, the gap (g1) between the first nanostructure 11a-1 and the second nanostructure 11a-2 may be smaller than the gap (g2) between the second nanostructure 11a-2 and the third nanostructure 11a-3, in some example embodiments, about 0.2 times to about 0.9 times as large as the gap (g2) between the second nanostructure 11a-2 and the third nanostructure 11a-3.

In some example embodiments, the gap (g1) between the first nanostructure 11a-1 and the second nanostructure 11a-2 may be larger than the gap (g2) between the second nanostructure 11a-2 and the third nanostructure 11a-3, in some example embodiments, about 1.05 times to about 5 times as large as the gap (g2) between the second nanostructure 11a-2 and the third nanostructure 11a-3.

However, it is not limited thereto, and when at least three nanostructures 11a are included in one unit cell (U), gaps (g) between two neighboring nanostructures 11a in one unit cell may differ one another, in some example embodiments, one gap (g) between two neighboring nanostructures 11a may be about 0.2 times to about 0.9 times or about 1.05 times to about 5 times as large as another gap (g) of another two neighboring nanostructures 11a.

In some example embodiments, a period (p) between two nanostructures 11a in each unit cell (U) or its neighboring unit cell (U) may differ from another period (p) between the rest of the nanostructures 11a. In some example embodiments, when the first nanostructure 11a-1 and the second nanostructure 11a-2 are included in a first unit cell (U1), and the third nanostructure 11a-3 and the fourth nanostructure 11a-4 are included in a second unit cell (U2), the period (p1) between the first nanostructure 11a-1 and the second nanostructure 11a-2 may differ from the period (p2) between the second nanostructure 11a-2 and the third nanostructure 11a-3.

In some example embodiments, a dimension, for example a width (W) and/or a thickness (t) of at least one nanostructure 11a out of the plurality of nanostructures 11a in each unit cell (U) may differ from a dimension, for example a width (W) and/or a thickness (t)), of the other nanostructures 11a, and the gap (g) and/or the period (p) between the plurality of nanostructures 11a in each unit cell (U) or its neighboring unit cell (U) may differ from gaps (g) and/or periods (p) between the other nanostructures 11a. In some example embodiments, when the first nanostructure 11a-1 and the second nanostructure 11a-2 are included in the first unit cell (U1), and the third nanostructure 11a-3 and the fourth nanostructure 11a-4 are included in the second unit cell (U2), the width (W1) and/or the thickness (t1) of the first nanostructure 11a-1 may differ from the width (W2) and/or the thickness (t2) of a second nanostructure 11a-2, and the gap (g1) between the first nanostructure 11a-1 and the second nanostructure 11a-2 may differ from the gap (g2) between the second nanostructure 11a-2 and the third nanostructure 11a-3.

In this way, a portion of the nanostructures 11a comprising the nanostructure array 11 may be changed with respect to a dimension and/or an alignment to modify an optical spectrum of the nanostructure array 11 having a consistent dimension and alignment of the nanostructures 11a.

In some example embodiments, a transmission spectrum and a reflection spectrum of the nanostructure array 11 having consistent dimension and alignment of the nanostructures 11a have a single peak in a near-infrared wavelength spectrum, but a transmission spectrum and a reflection spectrum of the nanostructure array 11 having different dimension and/or alignment of a portion of the nanostructures 11a may have two or more separate peaks in the near-infrared wavelength spectrum. Herein, the near-infrared wavelength spectrum may be greater than about 700 nm and less than or equal to about 1200 nm, within the range, for example greater than about 700 nm and less than or equal to about 1100 nm, about 700 nm to about 1000 nm, about 750 nm to about 1100 nm, about 750 nm to about 1000 nm, about 800 nm to about 1000 nm, about 850 nm to about 990 nm, about 870 nm to about 990 nm, or about 890 nm to about 990 nm.

In this way, the transmission spectrum and the reflection spectrum of the nanostructure array 11 have two or more separate peaks in the particular (or, alternatively, predetermined) near-infrared wavelength spectrum and thus may widen a wavelength width exhibiting particular (or, alternatively, predetermined) transmittance and reflectance compared with the spectra having a single peak.

Figure 13:
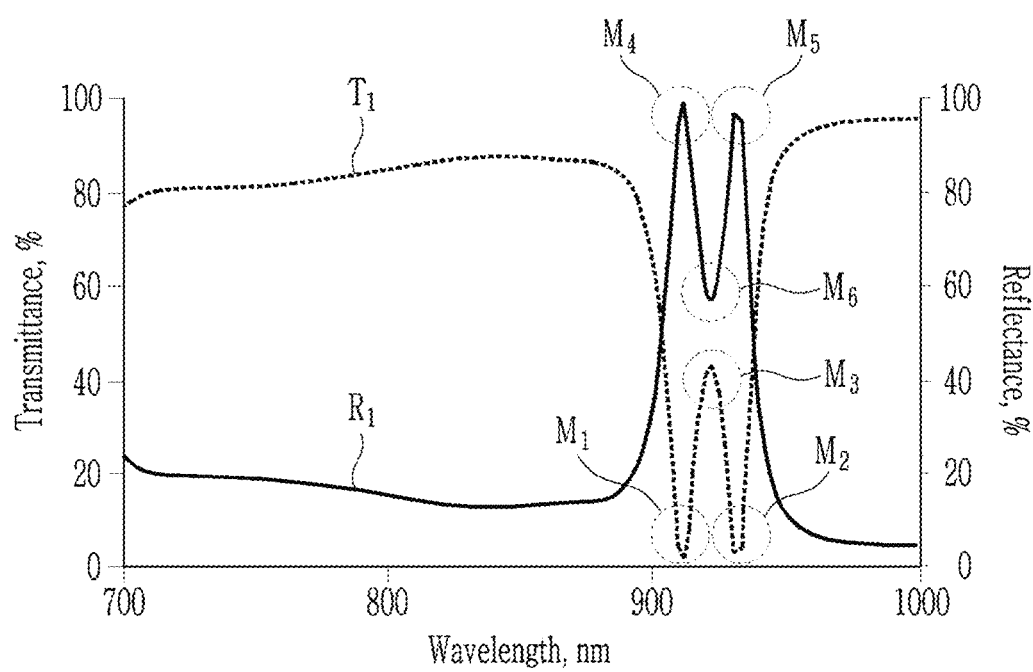
FIG. 13 is a graph showing an optical spectrum of a nanostructure array according to an example.

FIG. 13 is a graph showing an optical spectrum of a nanostructure array according to an example.

Referring to FIG. 13, a transmission spectrum ($T_1$) of the nanostructure array 11 has two separate peaks in a near-infrared wavelength spectrum, in some example embodiments, two separate local minimum points (relative minimum points, $M_1$ and $M_2$) and a local maximum point ($M_3$) between the two separate local minimum points ($M_1$ and $M_2$). Restated, the transmission spectrum ($T_1$) of the nanostructure array 11 may have a first local minimum point ($M_1$) and a second local minimum point ($M_2$) separated from each other, and a first local maximum point ($M_3$) between the first local minimum point ($M_1$) and the second local minimum point ($M_2$). Herein, the local minimum points ($M_1$ and $M_2$) may be an inflection point having lower transmittance than neighboring wavelengths, and the local maximum point ($M_3$) may be an inflection point having higher transmittance than the neighboring wavelengths. A minimum transmittance of the nanostructure array 11 may be transmittance at one of the local minimum points ($M_1$ or $M_2$).

Herein, the transmittance at the local minimum points ($M_1$ and $M_2$) and transmittance at the local maximum point ($M_3$) may have a relatively large difference. In some example embodiments, the difference between the transmittance at one of the local minimum points (e.g., either $M_1$ or $M_2$) and the transmittance of the local maximum point ($M_3$) may be larger ('greater") than about 30%, greater than about 30% and less than or equal to about 80%, about 40% to about 80%, about 40% to about 70%, or about 40% to about 60%. In some example embodiments, the transmittance at the local minimum points ($M_1$ and $M_2$) may be less than or equal to about 10%, less than or equal to about 5%, less than or equal to about 3%, less than or equal to about 2%, less than or equal to about 1%, less than or equal to about 0.5%, or about 0%, and the transmittance at the local maximum point ($M_3$) may be greater than about 10%, greater than about 10% and less than or equal to about 80%, about 15% to about 80%, about 20% to about 80%, about 25% to about 80%, about 30% to about 70%, about 35% to about 70%, about 40% to about 70%, or about 45% to about 70%.

In some example embodiments, when absorptance of the nanostructure array 11 in a near-infrared wavelength spectrum is substantially 0, a reflection spectrum $R_1$ of the nanostructure array 11 in the near-infrared wavelength spectrum may be symmetrical to a transmission spectrum ($T_1$), and the reflection spectrum $R_1$ has two separate local maximum points ($M_4$ and $M_5$) and a local minimum point ($M_6$) between the two separate local maximum points ($M_4$ and $M_5$).

The nanostructure array 11 according to some example embodiments may have a modified optical spectrum and widen a wavelength showing particular (or, alternatively, predetermined) transmittance compared with a nanostructure array 11 having consistent dimension and alignment of the nanostructures 11a. This modified optical spectrum of the nanostructure array 11 is complementarily combined with the light-absorbing layer 12 disposed adjacently thereto and thus may exhibit high light absorption characteristics in a wide wavelength width.

The light-absorbing layer 12 may be configured to absorb light of a particular (or, alternatively, predetermined) wavelength. As shown in at least FIG. 3, the light-absorbing layer 12 may be disposed adjacent to the nanostructure array 11 and for example may be in contact with some or all of the nanostructures 11a of the nanostructure array 11. As shown in at least FIG. 3, the light-absorbing layer 12 may be under (e.g., beneath) the plurality of the nanostructures 11a and may be in contact with a lower surface of some or all of the plurality of nanostructures 11a. In the drawing shown in at least FIG. 3, as an example, the light-absorbing layer 12 is disposed under the nanostructures 11a, but the present disclosure is not limited thereto. The light-absorbing layer 12 may be disposed at at least one of a lower surface, an upper surface, and/or one or more side surfaces of one or more of the nanostructures 11a and may be in contact with at least one of a lower surface, an upper surface, and/or one or more side surfaces of one or more of the nanostructures 11a.

The light-absorbing layer 12 includes a light-absorbing material configured to absorb light of a particular (or, alternatively, predetermined) wavelength. The light-absorbing material may be one or more of an organic material, an inorganic material, organic/inorganic material, or a combination thereof.

In some example embodiments, the light-absorbing layer 12 may include a near-infrared absorbing material configured to absorb light in at least a portion of near-infrared wavelength spectra. As described herein, "wavelength spectra" may include one or more wavelength spectra and may include a single wavelength spectrum, and in some example embodiments the light-absorbing layer 12 may include a near-infrared absorbing material configured to absorb light in at least a portion of the near-infrared wavelength spectrum, which may be the same near-infrared wavelength spectrum that includes a near-infrared wavelength that is larger than one or more dimensions of the unit cells. For example, the near-infrared absorbing material may be configured to absorb light in at least a portion of a wavelength spectrum of greater than about 700 nm and less than or equal to about 1200 nm and a maximum absorption wavelength ($\lambda_{max,A}$) of the near-infrared absorbing material may for example belong to a range of greater than about 700 nm and less than or equal to about 1100 nm, greater than about 700 nm and less than or equal to about 1000 nm, about 750 nm to about 1100 nm, about 750 nm to about 1000 nm, about 800 nm to about 1000 nm, about 850 nm to about 990 nm, about 870 nm to about 990 nm, or about 890 nm to about 990 nm.

The near-infrared absorbing material may be one or more materials, and is not particularly limited as long as it is configured to selectively absorb light in a near-infrared wavelength spectrum. The near-infrared absorbing material may be an organic material, an inorganic material, an organic/inorganic material, and/or a combination thereof.

The near-infrared absorbing material may include for example a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole) compound, a boron-dipyrromethene compound, a nickel-dithiol complex compound, a croconium compound, a derivative thereof, or a combination thereof, but is not limited thereto.

In some example embodiments, the light-absorbing layer 12 including the near-infrared absorbing material may have a refractive index (n) in a near-infrared wavelength spectrum in a range of less than about 2.0, less than or equal to about 1.9, or less than or equal to about 1.8, for example greater than or equal to about 1.1 and less than about 2.0, about 1.1 to about 1.9, or about 1.1 to about 1.8. In some example embodiments, an average refractive index (n) at a wavelength spectrum of about 900 nm to about 1000 nm (e.g., 940 nm) may be less than about 2.0, less than or equal to about 1.9, or less than or equal to about 1.8, for example greater than or equal to about 1.1 and less than about 2.0, about 1.1 to about 1.9, or about 1.1 to about 1.8. In some example embodiments, the light-absorbing layer 12 including the near-infrared absorbing material may have an extinction coefficient (k) in the near-infrared wavelength spectrum of about 0.001 to about 0.5, for example an extinction coefficient (k) in a wavelength spectrum of about 900 nm to about 1000 nm (e.g., 940 nm) of about 0.01 to about 0.5.

The light-absorbing layer 12 may be formed from a composition including the aforementioned near-infrared absorbing material, in some example embodiments, a curing product of the composition.

The composition may optionally further include a binder, in addition to the aforementioned near-infrared absorbing material. The binder may be for example an organic binder, an inorganic binder, an organic/inorganic binder, or a combination thereof, and is not particularly limited as long as it is a material capable of mixing with the near-infrared absorbing material, dispersing in the near-infrared absorbing material, or binding the near-infrared absorbing materials. The binder may be a curable binder, for example a thermally curable binder, a photo-curable binder, or a combination thereof.

The binder may be for example a (meth)acrylic binder, methyl cellulose, ethyl cellulose, hydroxypropyl methyl cellulose (HPMC), hydroxylpropyl cellulose (HPC), xanthan gum, polyvinyl alcohol (PVA), polyvinyl pyrrolidone (PVP), a cyclic olefin polymer (COP), carboxy methyl cellulose, hydroxyl ethyl cellulose, silicone, an organic-inorganic hybrid material, a copolymer thereof, or a combination thereof, but is not limited thereto.

The near-infrared absorbing material may be for example included in an amount of about 0.01 to about 50 parts by weight, about 0.01 to about 30 parts by weight, about 0.01 to about 20 parts by weight, about 0.01 to about 15 parts by weight, or about 0.01 to about 10 parts by weight based on 100 parts by weight of the binder.

The composition may optionally further include a solvent, in addition to the aforementioned near-infrared absorbing material, and binder.

The composition may be coated on the base layer 13 that will be described later, dried, and then optionally cured. The coating may be for example a spin coating, a slit coating, a bar coating, a blade coating, a slot die coating, and/or an inkjet coating. The drying may be for example performed by natural drying, hot air drying, and/or a heat treatment at a higher temperature than the boiling point of the aforementioned solvent. The curing may be thermal curing, photo curing, or a combination thereof.

The light-absorbing layer 12 may have a thickness 12t ranging from about 1 nm to about 1000 nm, within, the range, for example about 1 nm to about 800 nm, about 10 nm to about 700 nm, about 10 nm to about 500 nm, or about 10 nm to about 300 nm.

The base layer 13 is disposed under the nanostructure array 11 and the light-absorbing layer 12 and may support the nanostructure array 11 and the light-absorbing layer 12. The base layer 13 may be a transparent base layer and, in some example embodiments, have transmittance of greater than or equal to about 85% or greater than or equal to about 90% in a wavelength spectrum of about 400 nm to about 1000 nm.

The base layer 13 may have a lower refractive index than that of the nanostructures 11a, in some example embodiments, an average refractive index of less than or equal to about 1.7 in a range of about 900 nm to about 1000 nm (e.g., about 940 nm), in some example embodiments, in a range of about 1.4 to about 1.7. The base layer 13 may, in some example embodiments, include an organic material, an inorganic material, an organic/inorganic material, or a combination thereof, in some example embodiments, oxide, nitride, sulfide, fluoride, a polymer, or a combination thereof, in some example embodiments, glass, silicon oxide, aluminum oxide, magnesium fluoride, polystyrene, polymethylmethacrylate, polycarbonate, or a combination thereof, but is not limited thereto. The base layer 13 may be omitted as needed.

The combination structure 10 may have a thickness 10t of less than or equal to about 10 μm, less than or equal to about 5 μm, less than or equal to about 3 μm, less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm. In some example embodiments, the thickness of the combination structure 10 may be in a range of about 100 nm to about 10 μm, about 100 nm to about 5 μm, about 100 nm to about 3 μm, about 100 nm to about 2 μm, about 100 nm to about 1 μm, about 100 nm to about 900 nm, about 100 nm to about 800 nm, about 100 nm to about 700 nm, about 100 nm to about 600 nm, or about 100 nm to about 500 nm.

The combination structure 10 may exhibit high light absorption characteristics at a thin thickness by combining the nanostructure array 11 and the light-absorbing layer 12. This is based on unique optical properties of the nanostructure array 11 called to be a metamaterial or a metastructure, and the nanostructure array 11 and/or the nanostructures 11a may confine incident light of a particular (or, alternatively, predetermined) wavelength, and the confined light by the nanostructure array 11 and/or the nanostructures 11a may be multi-absorbed in the adjacent light-absorbing layer 12 and thus exhibit a high absorption effect.

An amount of the multi-absorbed light may be greatly higher than an amount of the absorbed light in a structure without nanostructure array 11, in which incident light from a structure having no nanostructure array 11, that is, a planar structure once passes the light-absorbing layer 12.

In addition, as described above, a portion of the nanostructures 11a forming the nanostructure array 11 may be changed to have different dimensions and/or alignments to exhibit a transmission spectrum having two separate peaks and thus a transmission spectrum having a relatively wide wavelength width.

The combination structure 10 may stably decrease transmittance and reflectance and increase absorptance in a relatively wide wavelength width due to the complementary combination of the nanostructure array 11 and the light-absorbing layer 12. The light-absorbing layer 12 may be configured to absorb light in a wavelength spectrum between two separate peaks in the transmission spectrum of the above nanostructure array 11 and thus decrease transmittance but increase absorptance in a wide wavelength width in a near-infrared wavelength spectrum of the combination structure 10. Ultimately, the combination structure 10 may decrease transmittance but increase absorptance in a wide range of the near-infrared wavelength spectrum and thus effectively block light in the near-infrared wavelength spectrum.

Figure 14:
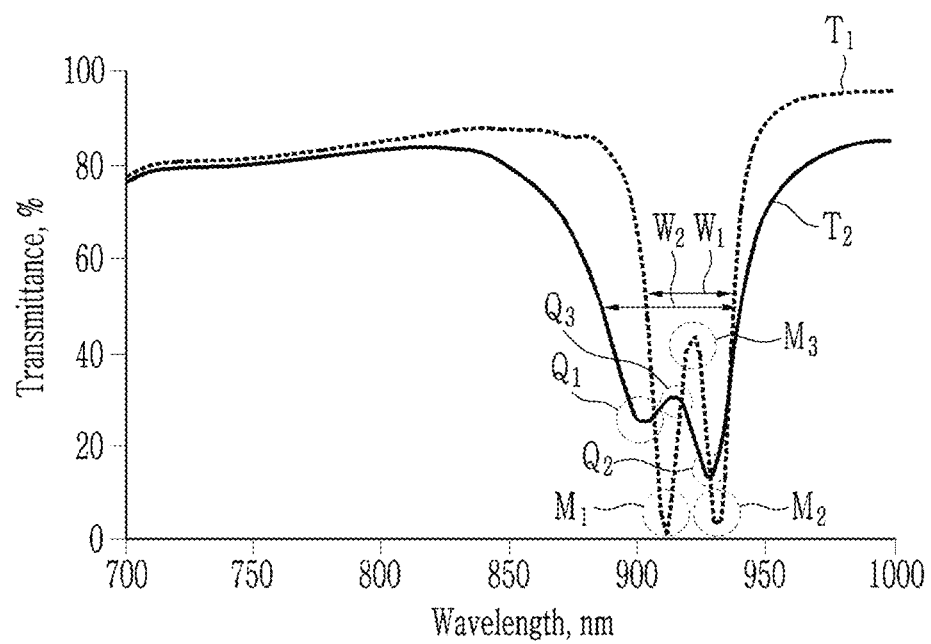
FIG. 14 is a graph showing a transmission spectrum of a combination structure according to an example.

FIG. 14 is a graph showing a transmission spectrum of a combination structure according to an example.

Referring to FIG. 14, the transmission spectrum ($T_2$) of the combination structure 10 is overlapped with at least a portion of the transmission spectrum ($T_1$) of the nanostructure array 11, but a wavelength width ($W_2$) of the transmission spectrum ($T_2$) of the combination structure 10 may be wider than a wavelength width ($W_1$) of the transmission spectrum ($T_1$) of the nanostructure array 11.

In some example embodiments, a wavelength width ($W_2$) at 50% transmittance in a near-infrared wavelength spectrum (e.g., the same particular near-infrared wavelength spectrum that the near-infrared absorbing material of the light-absorbing layer 12 is configured to absorb light in at least a portion thereof) of the transmission spectrum ($T_2$) of the combination structure 10 may be wider than a wavelength width ($W_1$) at 50% transmittance in the near-infrared wavelength spectrum of the transmission spectrum ($T_1$) of the nanostructure array 11, in some example embodiments, about 1.2 times to about 10 times and within the range, about 1.2 times to about 5 times or about 1.2 times to about 3 times as large as the wavelength width ($W_1$) at 50% transmittance in the near-infrared wavelength spectrum of the transmission spectrum ($T_1$) of the nanostructure array 11.

In some example embodiments, the wavelength width ($W_2$) at the transmittance of 50% in the near-infrared wavelength spectrum of the transmission spectrum ($T_2$) of the combination structure 10 may be about 38 nm to about 200 nm and within the range, about 40 nm to about 200 nm, about 40 nm to about 180 nm, or about 43 nm to about 150 nm.

In some example embodiments, the transmission spectrum ($T_2$) of the combination structure 10 in the near-infrared wavelength spectrum also may have two separate peaks, in some example embodiments, two separate local minimum points ($Q_1$ and $Q_2$) and a local maximum point ($Q_3$) between the two separate local minimum points ($Q_1$ and $Q_2$) like the transmission spectrum ($T_1$) of the nanostructure array 11 in the near-infrared wavelength spectrum. Restated, the transmission spectrum ($T_1$) of the combination structure 10 may have a first local minimum point ($Q_1$) and a second local minimum point ($Q_2$) separated from each other, and a first local maximum point ($Q_3$) between the first local minimum point ($Q_1$) and the second local minimum point ($Q_2$) Herein, the local minimum points ($Q_1$ and $Q_2$) may be inflection points having lower transmittance than neighboring wavelength spectra, and the local maximum point ($Q_3$) may be an inflection point having higher transmittance than the neighboring wavelength spectra. Minimum transmittance of the combination structure 10 may be transmittance at one of the local minimum points ($Q_1$ or $Q_2$).

As described above, the light-absorbing layer 12 may be configured to absorb light in a wavelength spectrum between two separate peaks in the transmission spectrum of the above nanostructure array 11, and accordingly, a transmittance difference between at one of the local minimum points (e.g., at either $Q_1$ or $Q_2$) of the combination structure 10 and at the local maximum point ($Q_3$) may be smaller than a transmittance difference between at one of the local minimum points ($M_1$ or $M_2$) of the nanostructure array 11 and at the local maximum point ($M_3$). In some example embodiments, the transmittance difference between at one of the local minimum points ($Q_1$ or $Q_2$) of the combination structure 10 and at the local maximum point ($Q_3$) may be less than or equal to about 30%, about 0 to about 30%, about 0.1% to about 30%, about 3% to about 30%, about 5% to about 30%, about 5% to about 20%, or about 5% to about 10%. When the transmittance difference between at one of the local minimum points ($Q_1$ or $Q_2$) of the combination structure 10 and at the local maximum point ($Q_3$) is about 0.5%, less than or equal to about 0.3%, less than or equal to about 0.1% or 0, the transmission spectrum may substantially have a single peak.

In some example embodiments, an optical spectrum of the combination structure 10 may have a minimum transmission wavelength ($\lambda_{min,T}$) in a wavelength spectrum of greater than about 700 nm and less than or equal to about 1200 nm, within the range, for example minimum transmission wavelength ($\lambda_{min,T}$) of greater than about 700 nm and less than or equal to about 1100 nm, greater than about 700 nm and less than or equal to about 1000 nm, about 750 nm to about 1100 nm, about 750 nm to about 1000 nm, about 800 nm to about 1000 nm, about 850 nm to about 990 nm, about 870 nm to about 990 nm, or about 890 nm to about 990 nm. A transmittance of the combination structure 10 at the minimum transmission wavelength ($\lambda_{min,T}$) may be less than or equal to about 35%, within the range, in some example embodiments, less than or equal to about 32%, less than or equal to about 30%, less than or equal to about 28%, less than or equal to about 25%, less than or equal to about 22%, less than or equal to about 20%, less than or equal to about 18%, less than or equal to about 15%, less than or equal to about 10%, or less than or equal to about 5%.

In some example embodiments, a reflectance in the near-infrared wavelength spectrum of the combination structure 10 may be significantly reduced compared with the reflectance in the near-infrared wavelength spectrum of the nanostructure array 11, and may be for example less than or equal to about 25%, less than or equal to about 22%, less than or equal to about 20%, less than or equal to about 15%, less than or equal to about 10%, less than or equal to about 5%, less than or equal to about 2%, or less than or equal to about 1%.

In some example embodiments, an absorptance of the combination structure 10 may be 100% minus the transmittance and reflectance, which may be for example expressed as the absorptance=100-transmittance-reflectance. In some example embodiments, an absorption spectrum of the combination structure 10 may have a maximum absorption wavelength ($\lambda_{max,A}$) in a wavelength spectrum of greater than about 700 nm and less than or equal to about 1200 nm, within the range for example greater than about 700 nm and less than or equal to about 1100 nm, greater than about 700 nm and less than or equal to about 1000 nm, about 750 nm to about 1100 nm, about 750 nm to about 1000 nm, about 800 nm to about 1000 nm, about 850 nm to about 990 nm, about 870 nm to about 990 nm, or about 890 nm to about 990 nm. An absorptance at a maximum absorption wavelength ($\lambda_{max,A}$) of the combination structure 10 may be greater than or equal to about 40%, greater than or equal to about 43%, greater than or equal to about 45%, or greater than or equal to about 50%, within the range, for example greater than or equal to about 55%, greater than or equal to about 60%, greater than or equal to about 65%, or greater than or equal to about 70%.

Figure 4:
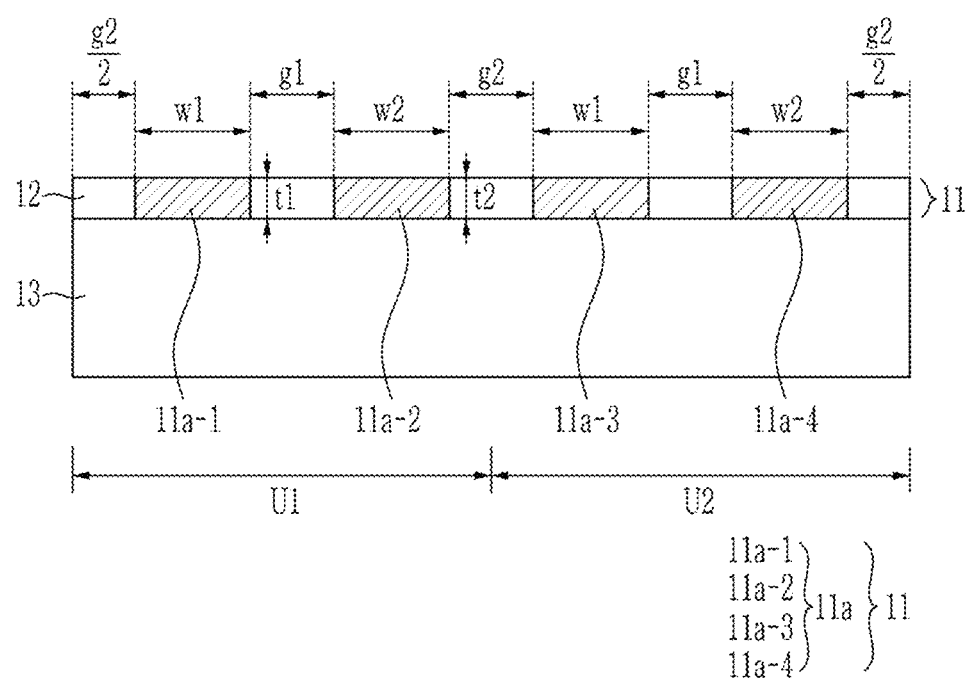
FIG. 4 is a schematic cross-sectional view showing another enlarged example of the region A of the combination structure 1 of FIG. 1.

FIG. 4 is a schematic cross-sectional view showing another enlarged example of the region A of the combination structure 1 of FIG. 1.

According to some example embodiments, a combination structure 10 includes the nanostructure array 11 including the plurality of nanostructures 11a; the light-absorbing layer 12; and the base layer 13, like some example embodiments, including the example embodiments shown in at least FIGS. 1-3.

However, in the combination structure 10 according to some example embodiments including the example embodiments shown in at least FIG. 4, unlike some example embodiments, including the example embodiments shown in FIGS. 1-3, the nanostructure array 11 and the light-absorbing layer 12 are disposed in the same layer. In some example embodiments, the light-absorbing layer 12 may be disposed at the side of a plurality of nanostructures 11a, the light-absorbing layer 12 may be in contact with a side of the nanostructure 11a.

Figure 5:
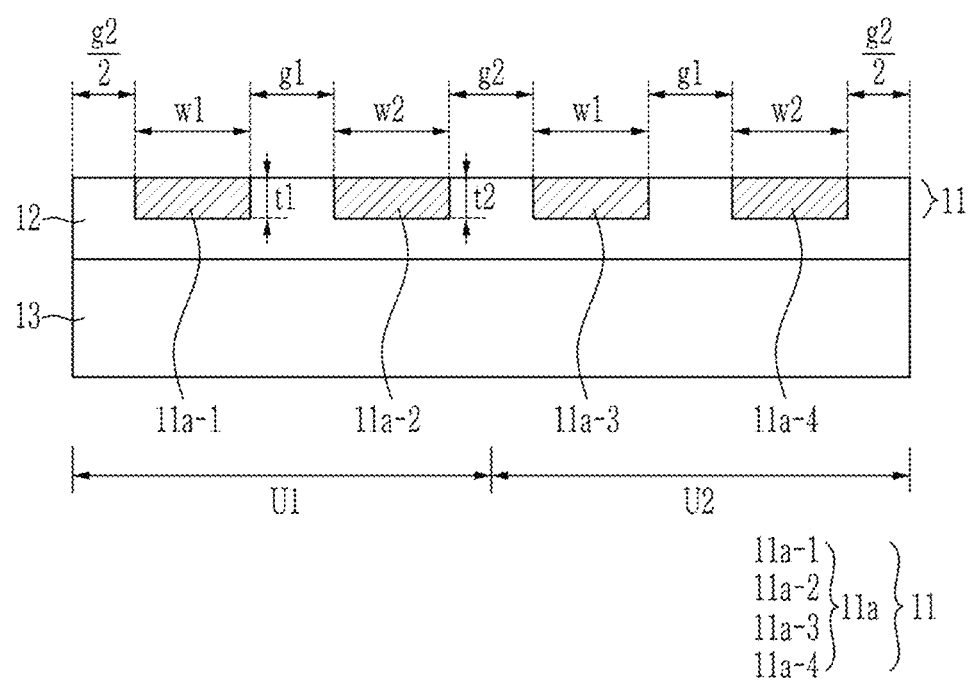
FIG. 5 is a schematic cross-sectional view showing another enlarged example of the region A of the combination structure 1 of FIG. 1.

FIG. 5 is a schematic cross-sectional view showing another enlarged example of the region A of the combination structure 1 of FIG. 1.

According to some example embodiments including the example embodiments shown in at least FIG. 5, a combination structure 10 includes the nanostructure array 11 including the plurality of nanostructures 11a; the light-absorbing layer 12; and the base layer 13, like some example embodiments including the example embodiments shown in at least FIG. 4.

However, the combination structure 10 according to some example embodiments including the example embodiments shown in at least FIG. 5, unlike some example embodiments including the example embodiments shown in at least FIG. 4, may include the light-absorbing layer 12 disposed under the nanostructure array 11 and in the same layer as the nanostructure array 11. In some example embodiments, the light-absorbing layer 12 may be disposed at the side of and under a plurality of nanostructures 11a, and the light-absorbing layer 12 may respectively contact at the side of and under the nanostructure 11a.

Figure 6:
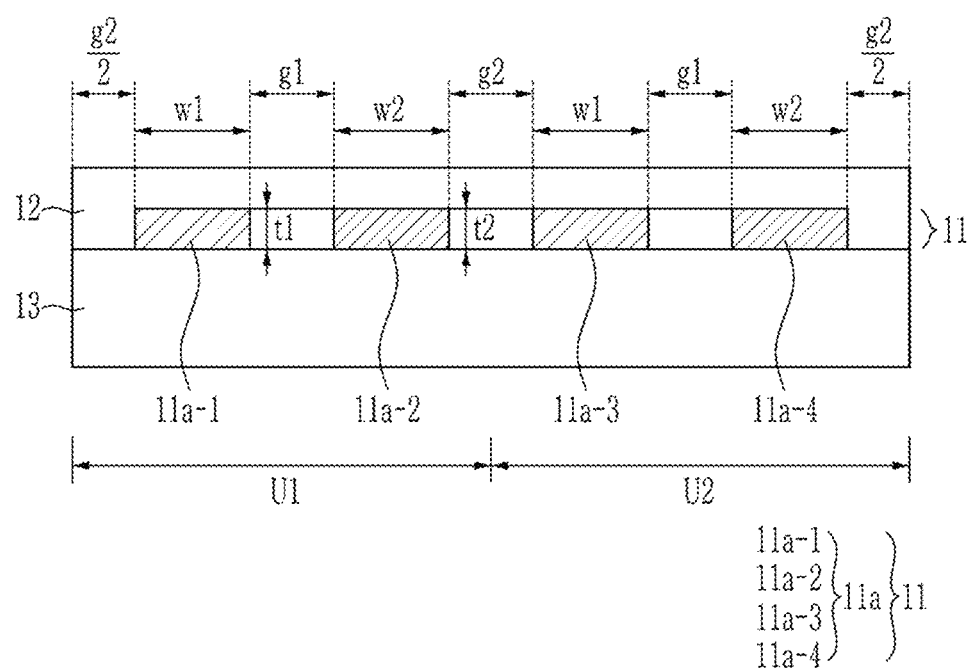
FIG. 6 is a schematic cross-sectional view showing another enlarged example of the region A of the combination structure 1 of FIG. 1.

FIG. 6 is a schematic cross-sectional view showing another enlarged example of the region A of the combination structure 1 of FIG. 1.

According to some example embodiments including the example embodiments shown in at least FIG. 4, a combination structure 10 includes the nanostructure array 11 including the plurality of nanostructures 11a; the light-absorbing layer 12; and the base layer 13, like some example embodiments including the example embodiments shown in at least FIG. 3.

However, the combination structure 10 according to some example embodiments including the example embodiments shown in at least FIG. 6, unlike some example embodiments including the example embodiments shown in at least FIG. 4, may include the light-absorbing layer 12 on the top and at the side of nanostructure array 11. In some example embodiments, the light-absorbing layer 12 may respectively contact on and at the side of the nanostructure 11a.

The aforementioned combination structure 10 may exhibit high light absorption characteristics with a thin thickness by increasing light absorption in at least a portion of near-infrared wavelength spectra, thereby realizing a thin thickness optical filter. In some example embodiments, the combination structure 10 configured to selectively absorb light in a near-infrared wavelength spectrum may be configured to effectively transmit light in a visible wavelength spectrum and effectively absorb light in a near-infrared wavelength spectrum and thus may be effectively applied as an optical filter configured to block light in the near-infrared wavelength spectrum in a sensor sensing light like an image sensor. In addition, the combination structure 10 may exhibit sufficient light absorption characteristics with a thin thickness and accordingly, may be integrated in the sensor like the image sensor and thus realize an internal optical filter, as described above.

The combination structure 10 may be applied as an optical filter to all applications for filtering light of a particular (or, alternatively, predetermined) wavelength spectrum, and may be effectively applied as a near-infrared cut filter configured to filter light in a near-infrared wavelength spectrum. The optical filter may be usefully applied to an electronic device including for example an image sensor, a camera module, and the like. The electronic device may be a digital camera, a camcorder, a monitoring camera such as CCTV, an in-car camera, a medical camera, a cell phone having a built-in or external camera, a computer having a built-in or external camera, a laptop computer having a built-in or external camera, a robot device having a built-in or external camera and the like but is not limited thereto.

Hereinafter, an example of a camera module provided with the aforementioned combination structure 10 is described.

Figure 7:
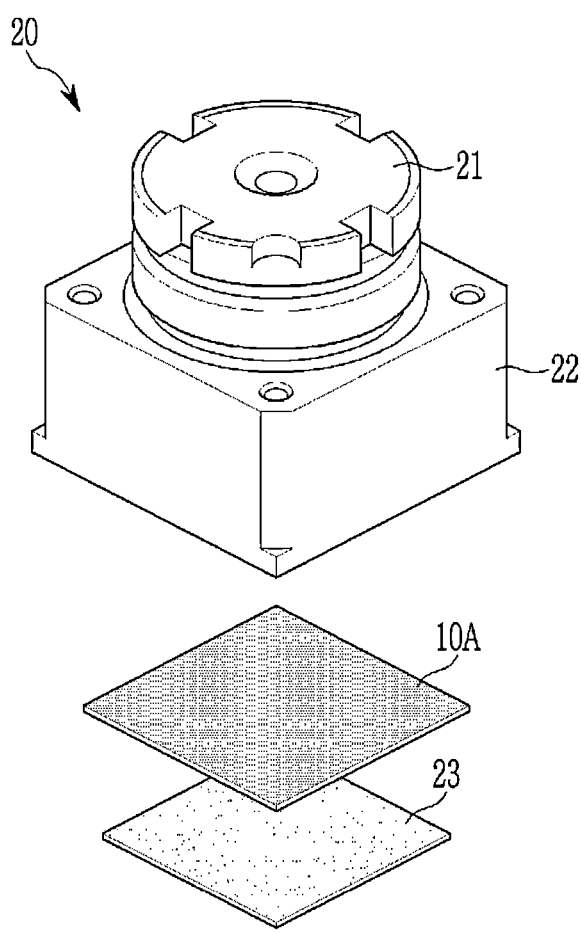
FIG. 7 is a schematic view illustrating an example of a camera module according to some example embodiments.

FIG. 7 is a schematic view showing an example of a camera module according to some example embodiments.

Referring to FIG. 7, a camera module 20, also referred to herein as simply a "camera," includes a lens barrel 21, a housing 22, an optical filter 10A, and an image sensor 23. In some example embodiments, the lens barrel 21 and/or the housing 22 may be omitted.

The lens barrel 21 includes at least one lens imaging a subject, and the lens may be disposed along an optical axis direction. Herein, the optical axis direction may be a vertical direction of the lens barrel 21. The lens barrel 21 is internally housed in the housing 22 and united with the housing 22. The lens barrel 21 may be moved in optical axis direction inside the housing 22 for autofocusing.

The housing 22 supports and houses the lens barrel 21 and the housing 22 may be open in the optical axis direction. Accordingly, incident light from the housing 22 may reach the image sensor 23 through the lens barrel 21 and the optical filter 10A.

The housing 22 may be equipped with an actuator for moving the lens barrel 21 in the optical axis direction. The actuator may include a voice coil motor (VCM) including a magnet and a coil. However, various methods such as a mechanical driving system or a piezoelectric driving system using a piezoelectric device except for the actuator may be adopted.

The optical filter 10A may include the aforementioned combination structure 10 and is the same as described above.

The optical filter 10A may have a thickness of less than or equal to about 10 μm, less than or equal to about 5 μm, less than or equal to about 3 μm, less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm. In some example embodiments, the optical filter 10A may have a thickness of about 100 nm to about 10 μm, about 100 nm to about 5 μm, about 100 nm to about 3 μm, about 100 nm to about 2 μm, about 100 nm to about 1 μm, about 100 nm to about 900 nm, about 100 nm to about 800 nm, about 100 nm to about 700 nm, about 100 nm to about 600 nm, or about 100 nm to about 500 nm.

The image sensor 23 may concentrate an image of a subject and thus store it as data, and the stored data may be displayed as an image through a display media.

The image sensor 23 may be mounted in a substrate (not shown) and electrically connected to the substrate. The substrate may be, in some example embodiments, a printed circuit board (PCB) or electrically connected to a printed circuit board, and the printed circuit may be, in some example embodiments, a flexible printed circuit (FPCB).

The image sensor 23 concentrates light passing the lens barrel 21 and the optical filter 10A and generates a video signal and may be a complementary metal-oxide semiconductor (CMOS) image sensor and/or a charge coupled device (CCD) image sensor.

Figure 8:
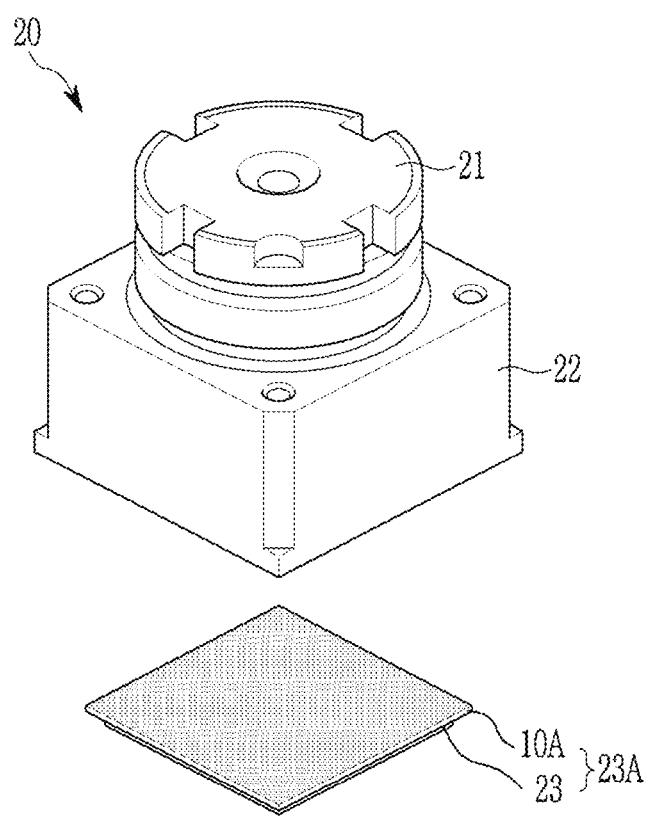
FIG. 8 is a schematic view illustrating an example of a camera module according to some example embodiments.

FIG. 8 is a schematic view showing another example of a camera module according to some example embodiments.

Referring to FIG. 8, a camera module 20 according to some example embodiments includes the lens barrel 21, the housing 22, the optical filter 10A, and the image sensor 23, like some example embodiments, including the example embodiments illustrated in FIG. 7.

However, in the camera module 20 according to some example embodiments including the example embodiments shown in at least FIG. 8, the optical filter 10A and the image sensor 23 may be in contact with each other, for example the optical filter 10A and the image sensor 23 may be integrally provided to embody an optical filter-integrated image sensor 23A, unlike some example embodiments including the example embodiments shown in at least FIG. 7.

Hereinafter, an example of an optical filter-integrated image sensor will be described with reference to a drawing. As an example of an image sensor, a CMOS image sensor is described.

Figure 9:
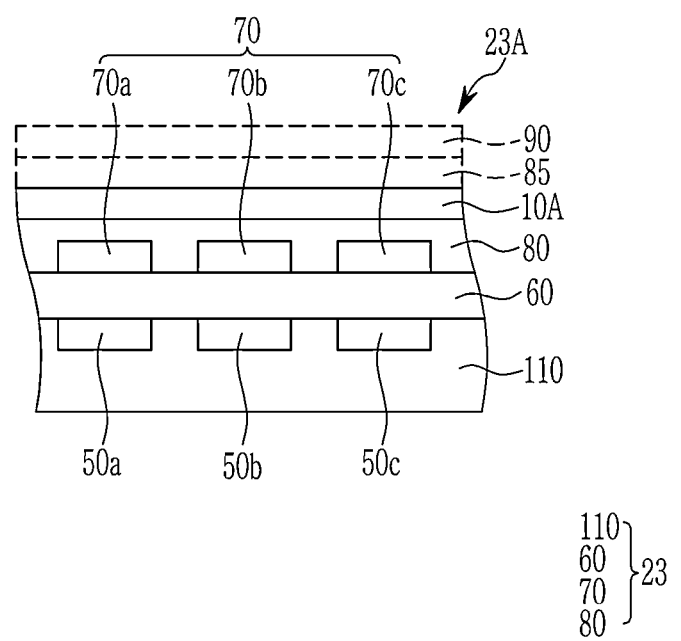
FIG. 9 is a cross-sectional view illustrating an example of an image sensor according to some example embodiments.

FIG. 9 is a cross-sectional view showing an example of an image sensor according to some example embodiments.

An integrated image sensor 23A according to some example embodiments includes an image sensor 23 including a semiconductor substrate 110, a lower insulation layer 60, a color filter layer 70 and an upper insulation layer 80; and an optical filter 10A.

The semiconductor substrate 110 may be a silicon substrate, and is integrated with the photo-sensing devices 50a, 50b, and 50c, and transmission transistor (not shown). The photo-sensing devices 50a, 50b, and 50c may be photodiodes. In some example embodiments, the photo-sensing device 50a may be a blue photo-sensing device 50a configured to sense light in a blue wavelength spectrum which passes a blue filter 70a described later, the photo-sensing device 50b may be a green photo-sensing device 50b configured to sense light in a green wavelength spectrum which passes a green filter 70b described later, and the photo-sensing device 50c may be a red photo-sensing device 50c configured to sense light in a red wavelength spectrum passes a red filter 70c described later. The photo-sensing devices 50a, 50b, and 50c and the transmission transistor may be integrated in each pixel. The photo-sensing devices 50a, 50b, and 50c sense light and the sensed information may be transferred by the transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but is not limited thereto. However, it is not limited to the structure, and the metal wire and pad may be disposed under the photo-sensing devices 50a, 50b, and 50c.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF.

A color filter layer 70 is formed on the lower insulation layer 60. The color filter layer 70 includes a blue filter 70a formed in a blue pixel, a green filter 70b formed in a green pixel, and a red filter 70c formed in a red pixel. However, the present disclosure is not limited thereto, but at least one of the blue filter 70a, the green filter 70b, or the red filter 70c may be replaced by a yellow filter, a cyan filter, or a magenta filter.

The upper insulation layer 80 is formed on the color filter layer 70. The upper insulation layer 80 may provide a flat surface by reducing stepped portions formed by the color filter layer 70. The upper insulation layer 80 may be made of an inorganic insulating material such as silicon oxide and/or silicon nitride or an organic insulating material. The upper insulation layer 80 may be omitted as needed.

The optical filter 10A is formed on the upper insulation layer 80. The optical filter 10A may be the aforementioned combination structure 10. As described above, the optical filter 10A may include the nanostructure array 11 including the plurality of nanostructures 11a; the light-absorbing layer 12; and the base layer 13, and may for example block light in a wavelength spectrum except for a visible wavelength spectrum such as a near-infrared wavelength spectrum. When the aforementioned upper insulation layer 80 is the same as the base layer 13 of combination structure 10, any one of the upper insulation layer 80 or the base layer 13 may be omitted. Detailed descriptions of the combination structure 10 are the same as described above.

Focusing lens 85 may be further formed on the optical filter 10A. However, the present disclosure is not limited thereto, and the optical filter 10A may be disposed on the focusing lens 85. The focusing lens 85 may control a direction of incident light and gather the light in one region. The focusing lens 85 may have a shape of, in some example embodiments, a cylinder or a hemisphere, but is not limited thereto.

A dual bandpass filter 90 may be disposed on the focusing lens 85. The dual bandpass filter 90 may selectively transmit light in at least two wavelength spectra of incident light and may for example selectively transmit light in a visible wavelength spectrum and in a near-infrared wavelength spectrum. For example, the dual bandpass filter 90 may be configured to selectively transmit light of an entirety of the visible wavelength spectrum and a portion (e.g., a limited portion) of the near-infrared wavelength spectrum.

As described above, the optical filter 10A may effectively transmit light in the visible wavelength spectrum and effectively absorb and block light in the other regions like the near-infrared region except for the visible wavelength spectrum and thus transfer pure light in the visible wavelength spectrum to the image sensor and accordingly, reduce or prevent a crosstalk generated when a signal by light of the visible wavelength spectrum is crossed and mingled with another signal by light of a non-visible wavelength spectrum and particularly, the near-infrared wavelength spectrum. Restated, the optical filter 10A may be configured to block light of at least a portion of a near-infrared wavelength spectrum. For example, the optical filter 10A may be configured to block said light of at least a portion of a near-infrared wavelength spectrum, of light that is incident on a surface of the optical filter 10A that is distal from the semiconductor substrate 110, from passing through the optical filter 10A to be incident on one or more portions and/or surfaces of some or all of the image sensor 23.

Particularly, the optical filter 10A may have a thin thickness of less than or equal to about 10 μm, less than or equal to about 5 μm, less than or equal to about 3 μm, less than or equal to about 2 μm, or less than or equal to about 1 μm, and thus the optical filter 10A and the image sensor 23 may be realized into an integrated image sensor 23A, and accordingly, may realize thinness of an image sensor, a camera module, and an electronic device equipped therewith.

Figure 10:
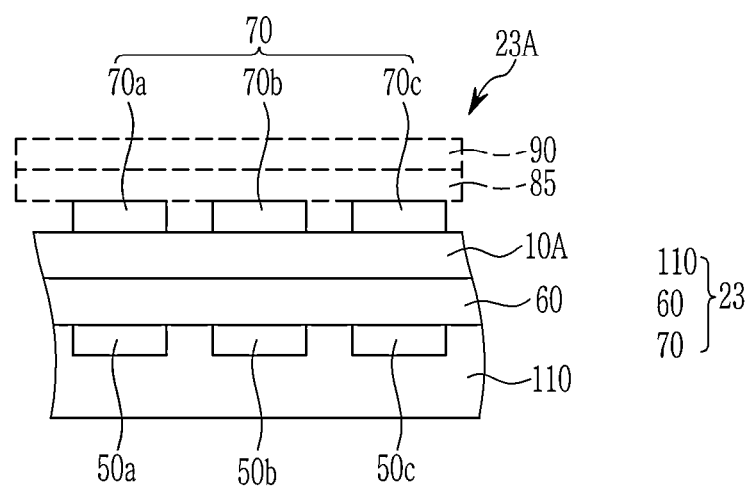
FIG. 10 is a cross-sectional view illustrating another example of an image sensor according to some example embodiments.

FIG. 10 is a cross-sectional view showing another example of an image sensor according to some example embodiments.

According to some example embodiments including the example embodiments shown in at least FIG. 10, an integrated image sensor 23A includes an image sensor 23 including the semiconductor substrate 110 integrated with photo-sensing devices 50a, 50b, and 50c, the lower insulation layer 60, and the color filter layer 70; and the optical filter 10A, like some example embodiments including the example embodiments shown in at least FIG. 9.

However, according to some example embodiments, including the example embodiments illustrated in FIG. 10, in the integrated image sensor 23A, the optical filter 10A is disposed under the color filter layer 70, unlike the example embodiments illustrated in FIG. 9. Accordingly, as shown in FIGS. 9-10, in some example embodiments an image sensor 23A may include a color filter layer 70, which may include one or more color filters 70a, 70b, or 70c, which may be on (e.g., indirectly on) the semiconductor substrate 110 and may be above (e.g., as shown in FIG. 10) or beneath (e.g., as shown in FIG. 9) the optical filter 10A. In the drawing, the optical filter 10A is illustrated as an example with a structure in which the optical filter 10A is disposed between the lower insulation layer 60 and the color filter layer 70. However, the present disclosure is not limited thereto and the optical filter 10A may be disposed between the semiconductor substrate 110 and the lower insulation layer 60.

Figure 11:
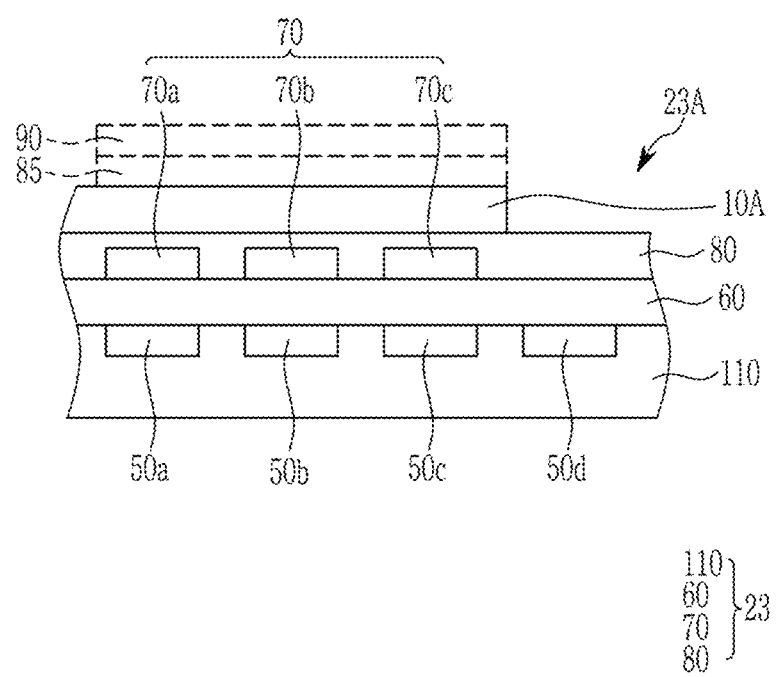
FIG. 11 is a cross-sectional view illustrating another example of an image sensor according to some example embodiments.

FIG. 11 is a cross-sectional view showing another example of an image sensor according to some example embodiments.

According to some example embodiments including the example embodiments shown in at least FIG. 11, an integrated image sensor 23A includes an image sensor 23 including the semiconductor substrate 110 integrated with photo-sensing device 50a, 50b, and 50c, the lower insulation layer 60, the color filter layer 70, and the upper insulation layer 80, and the optical filter 10A, like some example embodiments including the example embodiments shown in at least FIG. 9.

However, according to some example embodiments including the example embodiments shown in at least FIG. 11, the integrated image sensor 23A may include the photo-sensing device 50d for sensing light belonging to the infrared wavelength spectrum additionally integrated in the semiconductor substrate 110 unlike some example embodiments including the example embodiments shown in at least FIG. 9. The color filter layer 70 may include a transparent filter or a white color filter (not shown) at the position corresponding to the photo-sensing device 50d or just have an empty space without a separate filter.

The optical filter 10A may be disposed only either on or under the blue filter 70a, the green filter 70b, and the red filter 70c but neither on nor under the transparent filter or the white color filter.

The dual bandpass filter may for example selectively transmit light in a visible wavelength spectrum and in a near-infrared wavelength spectrum.

In some example embodiments, the photo-sensing device 50d may be used as an auxiliary device to improve the sensitivity of the image sensor in low-illumination environments.

In some example embodiments, the photo-sensing device 50d may be used as an infrared sensor configured to sense light in a near-infrared wavelength spectrum. The infrared sensor may extend a dynamic range specifically classifying a black/white contrast and thus increase sensing capability of a long distance 3-dimensional image. The infrared sensor may be for example a biometric sensor, for example an iris sensor, a depth sensor, a fingerprint sensor, a blood vessel distribution sensor, but is not limited thereto.

Figure 12:
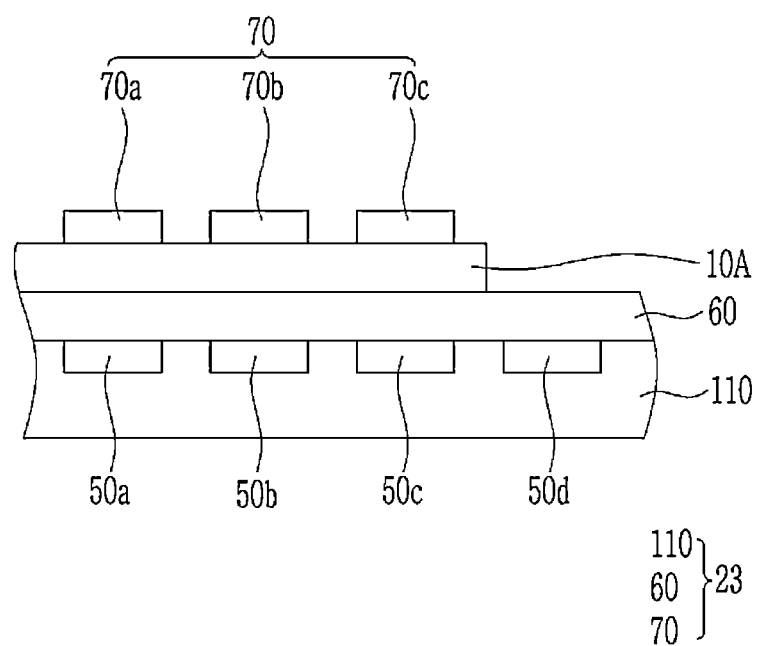
FIG. 12 is a cross-sectional view illustrating another example of an image sensor according to some example embodiments.

FIG. 12 is a cross-sectional view showing another example of an image sensor according to some example embodiments.

According to some example embodiments including the example embodiments shown in at least FIG. 12, an integrated image sensor 23A includes an image sensor 23 including the semiconductor substrate 110 integrated with photo-sensing devices 50a, 50b, 50c, and 50d, the lower insulation layer 60, and the color filter layer 70; and the optical filter 10A, like some example embodiments including the example embodiments shown in at least FIG. 11.

However, according to some example embodiments including the example embodiments shown in at least FIG. 12, in the integrated image sensor 23A, the optical filter 10A is disposed under the color filter layer 70, unlike some example embodiments including the example embodiments shown in at least FIG. 11. In the drawing, the optical filter 10A is illustrated as an example with a structure in which the optical filter 10A is disposed between the lower insulation layer 60 and the color filter layer 70. However, the present disclosure is not limited thereto and the optical filter 10A may be disposed between the semiconductor substrate 110 and the lower insulation layer 60.

Hereinafter, some example embodiments are illustrated in more detail with reference to examples. However, the present scope of the inventive concepts is not limited to these examples.

Manufacture of Near-infrared Absorbing Film

Preparation Example 1

A near-infrared absorbing compound (Epolight™ 1178, Epolin) and a cycloolefin polymer (poly[[octahydro-5-(methoxycarbonyl)-5-methyl-4,7-methano-1H-indene-1,3-diyl]-1,2-ethanediyl], CAS No. 123322-60-1, Sigma-Aldrich Co., Ltd.) are blended in a mixed solvent of chloroform and cyclohexanone (a weight ratio of 1:1) to prepare a composition. Herein, the near-infrared absorbing compound and the cycloolefin polymer in a weight ratio of 0.5:9.5 are used to have a concentration of 6.5 wt % of the composition. Subsequently, the composition is spin-coated (3000 rpm, 20 seconds) on a $SiO_2$ substrate to form an about 800 nm-thick film.

Preparation Example 2

A film is formed according to the same method as Preparation Example 1 except that the weight ratio of the near-infrared absorbing compound and the cycloolefin polymer is changed into 1:9.

Preparation Example 3

A film is formed according to the same method as Preparation Example 1 except that the weight ratio of the near-infrared absorbing compound and the cycloolefin polymer is changed into 1.5:8.5.

Preparation Example 4

A film is formed according to the same method as Preparation Example 1 except that the weight ratio of the near-infrared absorbing compound and the cycloolefin polymer is changed into 2:8.

Comparative Preparation Example 1

A film is formed according to the same method as Preparation Example 1 except that the near-infrared absorbing compound is not included.

Evaluation of Properties of Near-Infrared Absorbing Film

Properties of the films according to Preparation Examples 1 to 4 and Comparative Preparation Example 1 are examined.

Transmittance and absorptance are measured by using a UV-VIS-NIR spectrophotometer (Solid Spec-3700 DUV, Shimadzu Scientific Instruments), and a film thickness is measured by using Alpha-Step (D-500 Stylus Profiler, KLA Corp.). The transmittance and absorptance are used to obtain an extinction coefficient according to Relationship Equation.

$$T(A)=\exp(-\alpha(\lambda)d)=\exp(-4\pi/\lambda \times k(\lambda)d) \quad \text{[Relationship Equation]}$$

In Relationship Equation, $T(\lambda)$ indicates transmittance depending on a wavelength, $\lambda$ indicates a wavelength (unit: nm), $k(\lambda)$ indicates an extinction coefficient depending on a wavelength, and d indicates a film thickness (unit: nm).

The refractive index and the extinction coefficient are obtained from a polarized light characteristic change (Delta, Psi) by using an Ellipsometry equipment (J.A. Woollam Co.). Herein, the extinction coefficient obtained from Ellipsometry turns out to correspond with an extinction coefficient obtained from Relationship Equation 1.

The results are shown in Table 1.

TABLE 1

| | Average refractive index (n) (@900-1000 nm) | Average extinction coefficient (k) (@900-1000 nm) |
|---|---|---|
| Preparation Example 1 | 1.49 | 0.06 |
| Preparation Example 2 | 1.49 | 0.11 |
| Preparation Example 3 | 1.49 | 0.17 |
| Preparation Example 4 | 1.49 | 0.22 |
| Comparative Preparation Example 1 | 1.49 | 0 |

Design and Evaluation I of Combination Structure

Based on the properties of the films, an optical simulation with respect to combination structures is performed by using a FDTD (Finite-different time domain, Lumerical Inc.).

Example 1

A combination structure is formed to have a structure of forming a light-absorbing layer and a $TiO_2$ nanostructure array in the same layer on a $SiO_2$ substrate (FIG. 4).

The light-absorbing layer is designed to be 250 nm thick based on properties of the film according to Preparation Example 1.

The $TiO_2$ nanostructure array is obtained by designing a periodical pattern of the following $TiO_2$ nanostructure (a refractive index: 2.5 @ 940 nm).
Shape: cylinder
Shape of cross-section: rectangular
Width ($W_1$ and $W_2$): 420 nm,
Thickness ($t_1$ and $t_2$): 250 nm,
First gap ($g_1$): 200 nm
Second gap ($g_2$): 160 nm
First period ($p_1$): 620 nm
Second period ($p_2$): 580 nm Example 2

The same structure as that of Example 1 is formed except that the light-absorbing layer is designed based on properties of the film according to Preparation Example 2.

Example 3

The same structure as that of Example 1 is formed except that the light-absorbing layer is designed based on properties of the film according to Preparation Example 3.

Example 4

The same structure as that of Example 1 is formed except that the light-absorbing layer is designed based on properties of the film according to Preparation Example 4.

Example 5

The same structure as that of Example 1 is formed except that the $TiO_2$ nanostructure array is designed to have the following periodical pattern of the $TiO_2$ nanostructure.
Shape: cylinder
Shape of cross-section: rectangular
Width ($W_1$ and $W_2$): 420 nm,
Thickness ($t_1$ and $t_2$): 250 nm,
First gap ($g_1$): 180 nm
Second gap ($g_2$): 160 nm
First period ($p_1$): 600 nm
Second period ($p_2$): 580 nm Example 6

The same structure as that of Example 1 is formed except that the $TiO_2$ nanostructure array is designed to have the following periodical pattern of the $TiO_2$ nanostructure.
Shape: cylinder
Shape of cross-section: rectangular
Width ($W_1$ and $W_2$): 420 nm,
Thickness ($t_1$ and $t_2$): 250 nm,
First gap ($g_1$): 220 nm
Second gap ($g_2$): 160 nm
First period ($p_1$): 640 nm
Second period ($p_2$): 580 nm Reference Example 1

A structure is formed to have a 250 nm-thick light-absorbing layer on a $SiO_2$ base layer without the $TiO_2$ nanostructure array. The light-absorbing layer is designed based on properties of the film according to Preparation Example 1.

Reference Example 2

A combination structure is designed to have the cycloolefin polymer layer (no near-infrared absorbing compound) according to Comparative Preparation Example 1 and the $TiO_2$ nanostructure array in the same layer on a $SiO_2$ base layer (FIG. 4).
The cycloolefin polymer layer is designed to be 250 nm thick.
The $TiO_2$ nanostructure array is designed to have a periodical pattern of the $TiO_2$ nanostructure (a refractive index: 2.5 @940 nm) likewise Example 1.

Reference Example 3

The same structure as Example 1 is formed except that the $TiO_2$ nanostructure array is designed to have the following periodic pattern of the $TiO_2$ nanostructure.
Shape: cylinder
Shape of cross-section: rectangular
Width ($W_1$ and $W_2$): 420 nm,
Thickness ($t_1$ and $t_2$): 250 nm,
First and second gaps ($g_1$ and $g_2$): 160 nm
First and second period ($p_1$ and $p_2$): 580 nm

EVALUATION

Figure 15:
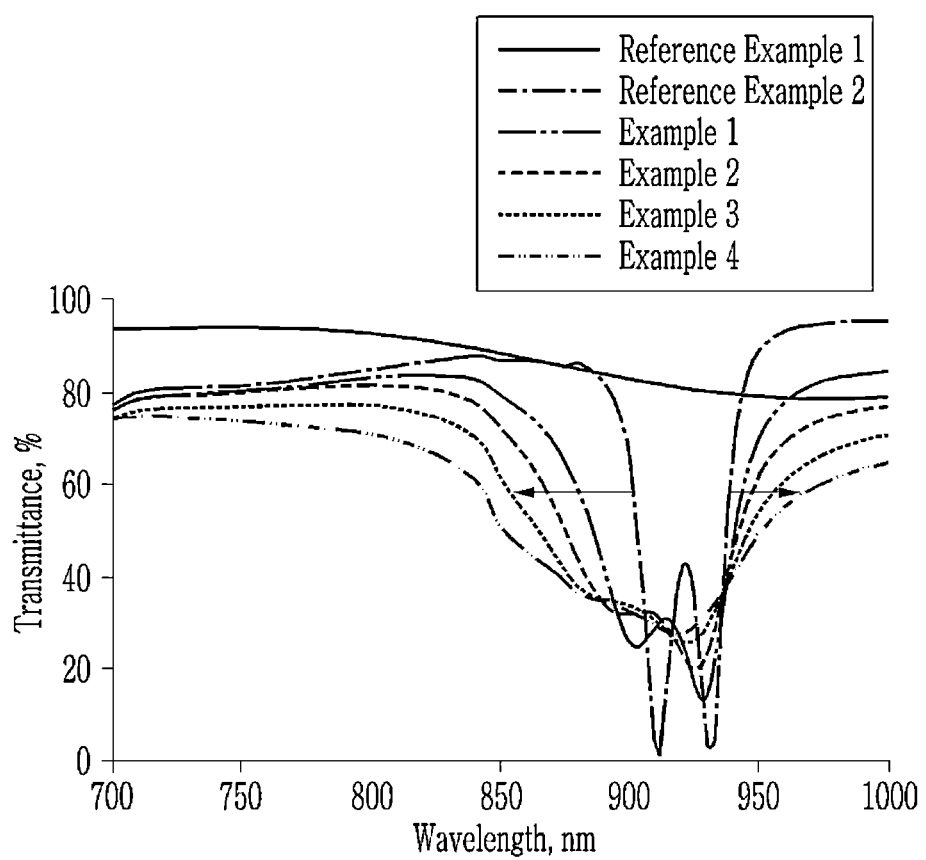
FIG. 15 is a graph showing transmission spectra according to Examples 1 to 4 and Reference Examples 1 and 2.
Figure 16:
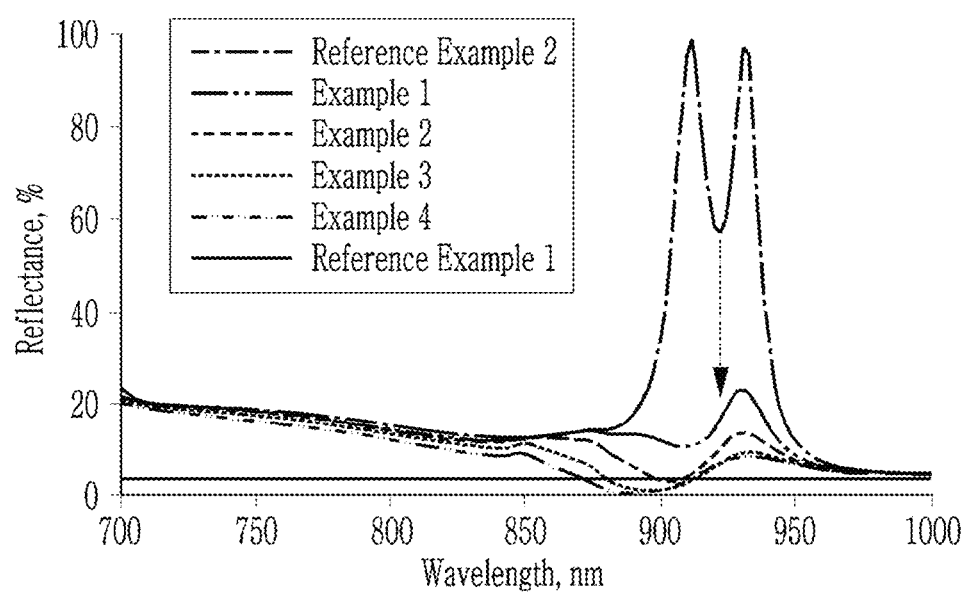
FIG. 16 is a graph showing reflection spectra according to Example 1 to 4 and Reference Examples 1 and 2.
Figure 17:
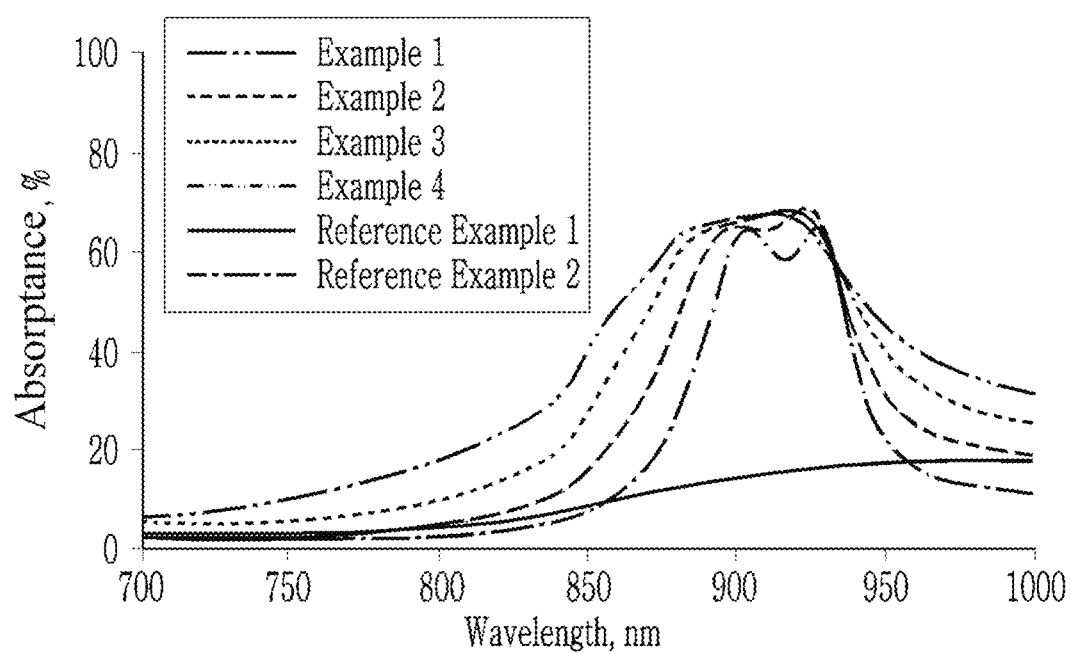
FIG. 17 is a graph showing absorption spectra according to Examples 1 to 4 and Reference Examples 1 and 2.
Figure 18:
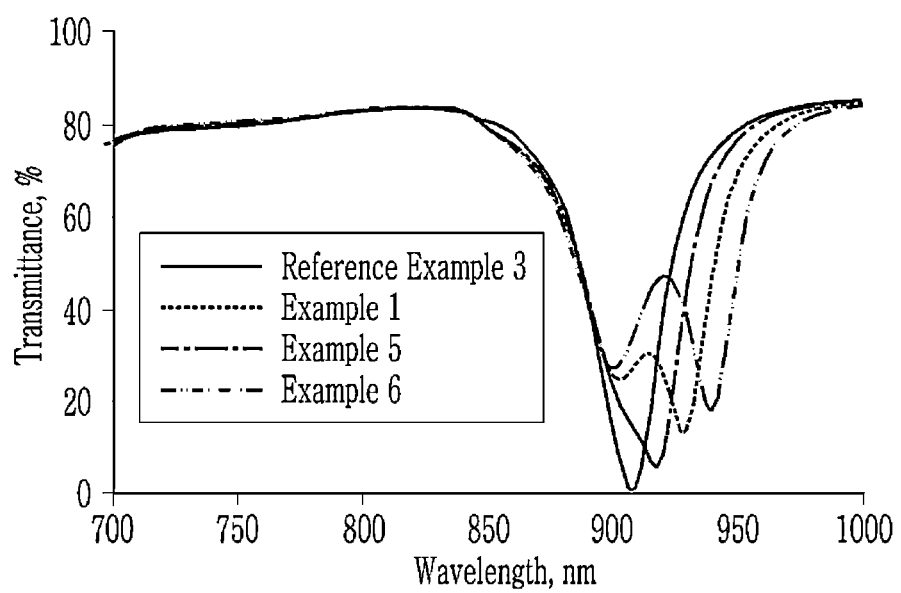
FIG. 18 is a graph showing transmission spectra according to Examples 1, 5, and 6 and Reference Example 3.
Figure 19:
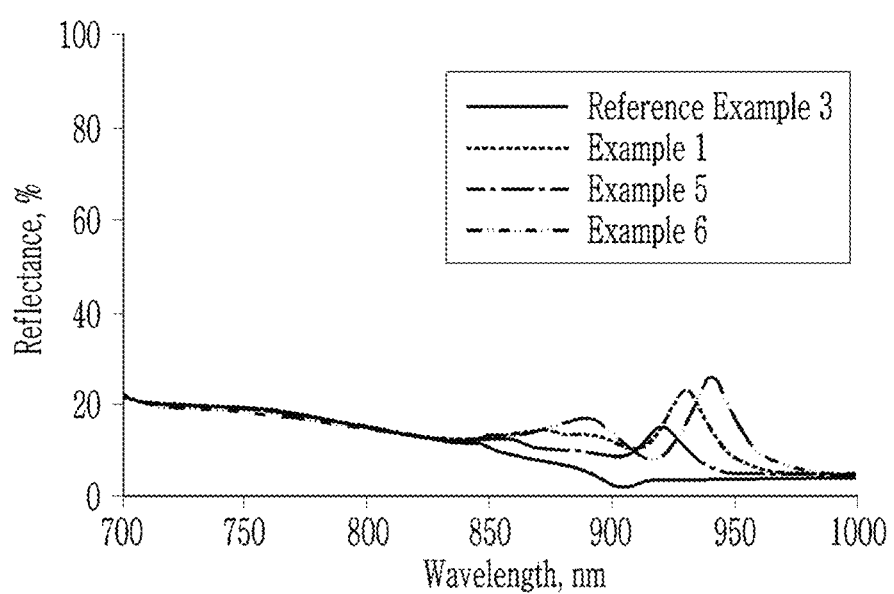
FIG. 19 is a graph showing reflection spectra according to Examples 1, 5, and 6 and Reference Example 3.
Figure 20:
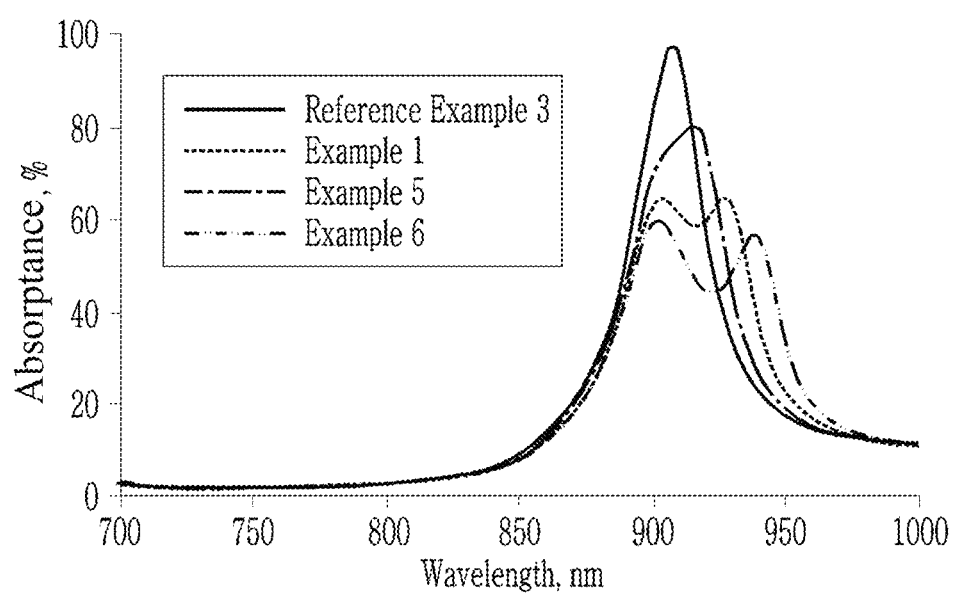
FIG. 20 is a graph showing absorption spectra according to Examples 1, 5 and 6 and Reference Example 3.

Optical properties of the structures according to Examples and Reference Examples are evaluated.
The results are shown in Tables 2 and 3 and FIGS. 15 to 20.
FIG. 15 is a graph showing transmission spectra according to Examples 1 to 4 and Reference Examples 1 and 2, FIG. 16 is a graph showing reflection spectra according to Example 1 to 4 and Reference Examples 1 and 2, FIG. 17 is a graph showing absorption spectra according to Examples 1 to 4 and Reference Examples 1 and 2, FIG. 18 is a graph showing transmission spectra according to Examples 1, 5, and 6 and Reference Example 3, FIG. 19 is a graph showing reflection spectra according to Examples 1, 5, and 6 and Reference Example 3, and FIG. 20 is a graph showing absorption spectra according to Examples 1, 5 and 6 and Reference Example 3.

TABLE 2

|  | Absorptance (@925 nm) (%) | Transmittance (@925 nm) (%) | Reflectance (@925 nm) (%) |
| --- | --- | --- | --- |
| Example 1 | 64.6 | 14.6 | 20.8 |
| Example 2 | 67.7 | 19.8 | 12.5 |
| Example 3 | 65.4 | 26.3 | 8.3 |
| Example 4 | 63.1 | 29.4 | 7.5 |
| Example 5 | 56.8 | 30.5 | 12.7 |
| Example 6 | 44.6 | 43.9 | 11.5 |
| Reference Example 1 | 15.7 | 81.1 | 3.2 |
| Reference Example 2 | 0.3 | 31.2 | 68.5 |
| Reference Example 3 | 40.4 | 56.4 | 3.2 |

TABLE 3

|  | Wavelength width (nm) at 50% transmittance | Transmittance (%) at local minimum point ($Q_1$ and $Q_2$) of peak | Transmittance (%) at local maximum point $Q_3$ of peak |
| --- | --- | --- | --- |
| Example 1 | 54 | 24.9/12.8 | 30.4 |
| Example 2 | 67 | 31.7/20.1 | 32.1 |
| Example 3 | 82 | 36.5/25.8 | 33.3 |
| Example 4 | 99 | 27.7 (single peak) | 37.0 |
| Example 5 | 43 | 6.6 (single peak) | 13.4 |
| Example 6 | 65 | 27.3/17.9 | 47.1 |

TABLE 3-continued

| | Wavelength width (nm) at 50% transmittance | Transmittance (%) at local minimum point ($Q_1$ and $Q_2$) of peak | Transmittance (%) at local maximum point $Q_3$ of peak |
|---|---|---|---|
| Reference Example 2 | 34 | 0.99/2.73 | 43.1 |
| Reference Example 3 | 35 | (single peak) | — |

Referring to Tables 2 and 3 and FIGS. 15 to 20, the structures according to Examples 1 to 6 exhibit improved light absorption characteristics in a relatively wide wavelength range due to complementary combination of the nanostructure array and the light-absorbing layer.

While this disclosure has been described in connection with what is presently considered to be practical example embodiments, it is to be understood that the inventive concepts are not limited to the above-described example embodiments. On the contrary, the inventive concepts are intended to cover various modifications and equivalent arrangements included within the spirit and scope of the appended claims.

What is claimed is:

1. A combination structure, comprising:
an in-plane pattern of unit cells,
wherein each unit cell of the unit cells includes
two or more nanostructures each having a smaller dimension than a near-infrared wavelength, and
a light-absorbing layer adjacent to at least one of a lower surface, an upper surface, or one or more side surfaces of one or more nanostructures of the two or more nanostructures, the light-absorbing layer including a near-infrared absorbing material configured to absorb light of at least a portion of a near-infrared wavelength spectrum,
wherein the unit cells include a first unit cell and a second unit cell adjacent to each other,
wherein the first unit cell includes a first nanostructure and a second nanostructure,
wherein the second unit cell includes a third nanostructure and a fourth nanostructure,
wherein the first nanostructure, second nanostructure, third nanostructure, and fourth nanostructure define a linear sequence of nanostructures extending in one direction, and
wherein
a dimension of the first nanostructure is different from a dimension of the second nanostructure, or
a magnitude of a gap between the first nanostructure and the second nanostructure is different from a magnitude of a gap between the second nanostructure and the third nanostructure.

2. The combination structure of claim 1, wherein
the dimension of the first nanostructure is different from the dimension of the second nanostructure, and
a width of the first nanostructure is about 1.05 times to about 5 times as large as a width of the second nanostructure.

3. The combination structure of claim 1, wherein
the dimension of the first nanostructure is different from the dimension of the second nanostructure, and
a thickness of the first nanostructure is about 1.05 times to about 5 times as large as a thickness of the second nanostructure.

4. The combination structure of claim 1, wherein
the magnitude of the gap between the first nanostructure and the second nanostructure differs from the magnitude of the gap between the second nanostructure and the third nanostructure, and
the gap between the first nanostructure and the second nanostructure is about 0.2 times to about 0.9 times as large as the gap between the second nanostructure and the third nanostructure.

5. The combination structure of claim 1, wherein
the magnitude of the gap between the first nanostructure and the second nanostructure differs from the magnitude of the gap between the second nanostructure and the third nanostructure, and
the gap between the first nanostructure and the second nanostructure is about 1.05 times to about 5 times as large as the gap between the second nanostructure and the third nanostructure.

6. The combination structure of claim 1, wherein a wavelength width at 50% transmittance of a transmission spectrum in the near-infrared wavelength spectrum of the combination structure is about 40 nm to about 200 nm.

7. The combination structure of claim 1, wherein the two or more nanostructures are in contact with the light-absorbing layer.

8. The combination structure of claim 1, wherein the near-infrared wavelength is in a range of greater than about 700 nm and less than or equal to about 1200 nm.

9. The combination structure of claim 8, wherein the near-infrared wavelength is in a range of about 890 nm to about 990 nm.

10. The combination structure of claim 1, wherein the two or more nanostructures each include a material having a refractive index at 940 nm of greater than or equal to about 2.0.

11. The combination structure of claim 10, wherein the two or more nanostructures each include titanium oxide, silicon, aluminum, a Group III-V semiconductor compound, or a combination thereof.

12. The combination structure of claim 1, wherein a maximum absorption wavelength of the near-infrared absorbing material is in a range of about 700 nm to about 1100 nm.

13. The combination structure of claim 12, wherein the maximum absorption wavelength of the near-infrared absorbing material is in a range of about 890 nm to about 990 nm.

14. The combination structure of claim 1, wherein a thickness of the combination structure is less than or equal to about 1 μm.

15. An optical filter comprising the combination structure of claim 1.

16. An image sensor, comprising:
a semiconductor substrate including a plurality of photodiodes, and
the optical filter of claim 15, the optical filter being on the semiconductor substrate.

17. The image sensor of claim 16, further comprising a color filter between the semiconductor substrate and the optical filter.

18. A camera comprising the image sensor of claim 16.

19. An electronic device comprising the camera of claim 18.

20. An electronic device comprising the optical filter of claim 15.

* * * * *